(12) United States Patent
Hiraoka et al.

(10) Patent No.: US 8,020,240 B2
(45) Date of Patent: Sep. 20, 2011

(54) SUBSTRATE TREATMENT APPARATUS

(75) Inventors: Nobuyasu Hiraoka, Kyoto (JP);
Tsuyoshi Okumura, Kyoto (JP);
Akiyoshi Nakano, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1046 days.

(21) Appl. No.: 11/693,985

(22) Filed: Mar. 30, 2007

(65) Prior Publication Data
US 2007/0226924 A1      Oct. 4, 2007

(30) Foreign Application Priority Data

| Mar. 30, 2006 | (JP) | 2006-095549 |
| Mar. 30, 2006 | (JP) | 2006-095551 |

(51) Int. Cl.
*B08B 1/04* (2006.01)
(52) U.S. Cl. .............. 15/77; 15/102; 15/88.2
(58) Field of Classification Search ............ 15/102, 15/77, 88.2, 88.3
See application file for complete search history.

(56) References Cited

U.S. PATENT DOCUMENTS

| 5,861,066 | A | 1/1999 | Moinpour et al. | |
|---|---|---|---|---|
| 6,550,091 | B1 | 4/2003 | Radman et al. | |
| 6,647,579 | B2 * | 11/2003 | Manfredi et al. | 15/77 |
| 6,648,979 | B2 * | 11/2003 | Lofaro et al. | 134/6 |

FOREIGN PATENT DOCUMENTS

| JP | 6-45302 | 2/1994 |
|---|---|---|
| JP | 9-319517 | 12/1997 |
| JP | 10-261605 | 9/1998 |
| JP | 2000-49131 | 2/2000 |
| JP | 2000-049131 | 2/2000 |
| JP | 2001-9386 | 1/2001 |
| JP | 2001-212531 | 8/2001 |
| JP | 2003-151943 | 5/2003 |
| JP | 2003-197592 | 7/2003 |
| JP | 2003-309096 | 10/2003 |

OTHER PUBLICATIONS

Office Action issued Jul. 24, 2008 in connection with corresponding Korean Patent Application No. 10-2007-0030354.
Office Action issued Aug. 7, 2009 in connection with corresponding Chinese Patent Application No. 200710091931.7.
Notification of Reason for Refusal issued Sep. 16, 2010 in connection with corresponding Japanese Patent Application No. 2006-095551 (JP2000-049131 was previously cited in an IDS filed Sep. 21, 2009 and is therefore not enclosed.).
Notification of Reason for Refusal issued Oct. 7, 2010 in connection with corresponding Japanese Patent Application No. 2006-095549.

* cited by examiner

*Primary Examiner* — Shay Karls
(74) *Attorney, Agent, or Firm* — Ostrolenk Faber LLP

(57) ABSTRACT

A substrate treatment apparatus includes a substrate holding mechanism for holding a substrate, a brush made of an elastically deformable material and having a cleaning surface formed in a shape tapered toward one side in a perpendicular direction perpendicular to one surface of the substrate held by the substrate holding mechanism and inclined with respect to the perpendicular direction, a brush moving mechanism for moving the brush with respect to the substrate held by the substrate holding mechanism, and a control unit for controlling the brush moving mechanism so that the cleaning surface is pushed to a peripheral area on the one surface and a peripheral end face of the substrate held by the substrate holding mechanism.

15 Claims, 17 Drawing Sheets

SUBSTRATE TREATMENT APPARATUS

BACKGROUND OF THE INVENTION

The present invention relates to a substrate apparatus and a substrate treatment method for cleaning substrates. Substrates to be treated include semiconductor wafers, substrates for liquid crystal displays, substrates for plasma displays, substrates for FEDs (Field Emission Displays), substrates for optical discs, substrates for magnetic discs, substrates for magneto-optical discs, substrates for photomasks, etc.

DESCRIPTION OF RELATED ART

In semiconductor device manufacturing processes, contaminants attached to the peripheral portion of a semiconductor wafer may have nonnegligible influence on the quality of the treated semiconductor wafer.

In the so-called batch treatment process, multiple semiconductor wafers are held in a vertical posture and immersed in treatment liquid. Hence, if contaminants are attached to the peripheral portion of each semiconductor wafer, the contaminants are dispersed into the treatment liquid and attached again to the device forming area on the front surface of the semiconductor wafer.

Therefore, in recent years, the need for cleaning the peripheral portions of substrates, such as semiconductor wafers, has increased.

As prior art regarding the cleaning of the peripheral portions of substrates, the configurations proposed in Document 1 (Japanese Unexamined Patent Publication No. 2003-197592), Document 2 (Japanese Unexamined Patent Publication No. 2003-151943) and Document 3 (U.S. Pat. No. 6,550,091) can be taken as examples.

Document 1 proposes a configuration in which a cylindrical brush is provided, and the outer circumferential face of the brush is made to contact with the peripheral end face of a substrate while the substrate is rotated, thereby removing contaminants attached to the peripheral end face of the substrate.

Document 2 proposes a configuration similar to the configuration proposed in Document 1, in which a cylindrical brush is pushed to the peripheral end face of a substrate, and the peripheral end face of the substrate is allowed to bite into the outer circumferential face of the brush so that contaminants attached to the peripheral end face of the substrate can be removed more satisfactorily regardless of the shape of the peripheral end face of the substrate. Furthermore, another configuration has been proposed in which a groove corresponding to the shape of the peripheral end face of the substrate is formed in the outer circumferential face of a brush and the peripheral end face of the substrate is fitted in the groove.

Document 3 proposes a configuration in which a groove into which the peripheral portion of a substrate can be fitted is formed in the outer circumferential surface of a cylindrical brush, the substrate is rotated while the peripheral portion of the substrate is fitted in this groove, and the brush is rotated around its central axis, whereby the peripheral areas (the ring-shaped areas with a predetermined width from respective peripheral edges on the front surface and the back surface of the substrate) on the front surface and the back surface and the peripheral end face of the substrate are cleaned.

According to the configurations proposed in Documents 1 and 2, contaminants attached to the peripheral end face of a substrate can be removed. However, since the brush does not make contact with the peripheral areas on the front surface and the back surface of the substrate, contaminants attached to the peripheral areas cannot be removed.

On the other hand, according to the configuration proposed in Document 3, the peripheral areas on the front surface and the back surface of a substrate can be cleaned. However, the cleaning width (the contact width of the brush) in the peripheral areas on the front surface and the back surface of the substrate cannot be changed easily. For solving this problem, it is conceivable to change the cleaning width in the peripheral areas on the front surface and the back surface of the substrate by changing the amount of insertion of the peripheral portion of the substrate into the groove of the brush. However, if the amount of insertion of the peripheral portion of the substrate into the groove of the brush is small, the brush does not make contact with the peripheral end face of the substrate and cannot clean the peripheral end face of the substrate. Hence, it is impossible to use the method of changing the amount of insertion of the peripheral portion of the substrate into the groove of the brush. Therefore, when the cleaning width in the peripheral portion is changed, the brush must be replaced with a brush having a groove with a different depth. This method is very troublesome.

In addition, the brush having the configuration proposed in Document 3 can clean the peripheral areas on the front and back surfaces of substrates having a constant thickness. However, the brush cannot properly clean the peripheral areas on the front and back surfaces of substrates having thicknesses other than the constant thickness. In other words, if the thickness of a substrate is larger than the constant thickness, the peripheral portion of the substrate cannot be fitted into the groove of the brush. Furthermore, if the thickness of a substrate is smaller than the constant thickness, the pushing force of the brush to the peripheral areas on the front and back surfaces of the substrate becomes weak, and the brush cannot properly clean the peripheral areas.

SUMMARY OF THE INVENTION

A first object of the present invention is to provide a substrate treatment apparatus and a substrate treatment method capable of cleaning the peripheral area on one surface and the peripheral end face of a substrate simultaneously and capable of easily changing the cleaning width in the peripheral area.

To attain the first object, a substrate treatment apparatus (hereinafter, in this section referred to as "first substrate treatment apparatus") according to the present invention includes a substrate holding mechanism for holding a substrate; a brush made of an elastically deformable material and having a cleaning surface formed in a shape tapered toward one side in a perpendicular direction perpendicular to one surface of the substrate held by the substrate holding mechanism and inclined with respect to the perpendicular direction; a brush moving mechanism for moving the brush with respect to the substrate held by the substrate holding mechanism, and a control unit for controlling the brush moving mechanism so that the cleaning surface is pushed to a peripheral area on the one surface and a peripheral end face of the substrate held by the substrate holding mechanism.

The cleaning surface of the brush is pushed to the peripheral area on the one surface and the peripheral end face of the substrate by controlling the brush moving mechanism. The cleaning surface of the brush is inclined with respect to a perpendicular direction perpendicular to the one surface of the substrate. Therefore, the cleaning surface can be pushed securely to the peripheral area on the one surface and the peripheral end face of the substrate by allowing the peripheral portion of the substrate (a portion including the peripheral area on the one surface and the peripheral end face of the substrate) to bite into the cleaning surface. Accordingly, the peripheral area on the one surface and the peripheral end face of the substrate can be cleaned simultaneously.

Furthermore, the effective contact width between the peripheral area on the one surface of the substrate and the cleaning surface can be changed by changing the pushing amount of the brush to the substrate (the amount of elastic deformation of the brush when the cleaning surface of the brush is pushed to the substrate). Therefore, the cleaning width in the peripheral area on the one surface of the substrate can be changed easily by changing the pushing amount of the brush to the substrate.

The brush may have a tip end portion formed in a generally conical shape being rotationally symmetrical around the central axis thereof extending in the perpendicular direction. In this case, it is possible to obtain a cleaning surface inclined with respect to a perpendicular direction perpendicular to the one surface of the substrate by using the side surface of the tip end portion as the cleaning surface.

Furthermore, the brush may have a tip end portion formed in a generally truncated conical shape being rotationally symmetrical around the central axis thereof extending in the perpendicular direction. In this case, it is possible to obtain a cleaning surface inclined with respect to a perpendicular direction perpendicular to the one surface of the substrate by using the side surface of the tip end portion as the cleaning surface.

Since the cleaning surface is inclined at a constant angle with respect to the perpendicular direction, the effective contact width (the cleaning width using the brush) between the peripheral area on the one surface of the substrate and the cleaning surface becomes the same, when the pushing amount of the brush is the same, regardless of into which area of the cleaning surface the peripheral portion of the substrate is allowed to bite. Consequently, when a partial area of the cleaning surface is worn out by the cleaning of the substrate or when contaminants are accumulated excessively in the partial area, the other area of the cleaning surface is used, whereby the peripheral area on the one surface and the peripheral end face of the substrate can be cleaned satisfactorily without interruption.

The cleaning surface may have a curved shape swelling outward in the direction of the rotation radius of the tip end portion. Alternatively, the cleaning surface may have a curved shape recessed inward in the direction of the rotation radius of the tip end portion. Since the cleaning surface of the brush swells outward or recesses inward in the direction of the rotation radius of the tip end portion, the inclination angle with respect to a perpendicular direction perpendicular to the one surface of the substrate is different depending on each position in the direction of the generating line of the cleaning surface of the brush. With this configuration, the peripheral area on the one surface and the peripheral end face of the substrate can be cleaned more satisfactorily by changing the position of the contact between the substrate and the cleaning surface of the brush in the direction of the generating line of the cleaning surface. In other words, when the peripheral portion of the substrate bites into an area of the cleaning surface of the brush in which the inclination angle thereof with respect to a perpendicular direction to the one surface of the substrate is small, the cleaning surface can be made contact with the peripheral end face of the substrate securely, and the peripheral end face can be cleaned satisfactorily. On the other hand, when the peripheral portion of the substrate bites into an area of the cleaning surface of the brush in which the inclination angle thereof with respect to the perpendicular direction to the one surface of the substrate is large, the cleaning surface can be made contact with the peripheral area on the one surface of the substrate securely, and the peripheral area can be cleaned satisfactorily.

It is preferable that the brush has a rotationally symmetrical shape and that the substrate treatment apparatus includes a brush rotation mechanism for rotating the brush around the central axis thereof. In this case, the peripheral end face of the substrate can be scrubbed by rotating the brush by the brush rotation mechanism while the cleaning surface of the brush is pushed to the peripheral end face of the substrate. Hence, peripheral area on the one surface and the peripheral end face of the substrate can be cleaned more satisfactorily.

It is preferable that the first substrate treatment apparatus includes a brush rotation mechanism for rotating the brush around the axis thereof extending in the perpendicular direction. In this case, the peripheral area on the one surface and the peripheral end face of the substrate can be scrubbed by rotating the brush by the brush rotation mechanism while the cleaning surface of the brush is pushed to the peripheral area on the one surface and the peripheral end face of the substrate. Therefore, the peripheral area on the one surface and the peripheral end face of the substrate can be cleaned more satisfactorily.

It is preferable that the first substrate treatment apparatus includes a brush relative movement mechanism for relatively moving the substrate held by the substrate holding mechanism and the brush so that the brush is moved in the circumferential direction of the substrate. In this case, by virtue of the relative movement of the brush and the substrate, the peripheral area on the one surface and the peripheral end face of the substrate can be cleaned efficiently.

It is preferable that the first substrate treatment apparatus includes a treatment liquid supply mechanism for supplying a treatment liquid to an area located more inward than the peripheral area on at least the one surface of the substrate held by the substrate holding mechanism. In this case, contaminants attached to the area located more inward than the peripheral area on the one surface of the substrate can be cleaned away by the treatment liquid. In particular, when the inward area on the one surface of the substrate is a device forming area and a treatment liquid that does not adversely affect the device forming area, for example, pure water or functional water, is used as the treatment liquid, the treatment liquid also acts as a protective liquid. Hence, the contaminants removed from the peripheral portion of the substrate by the brush can be prevented from entering the device forming area. Therefore, the device forming area can be prevented from being polluted by the contaminants.

A substrate treatment method according to the present invention for attaining the first object includes a substrate holding step for holding a substrate by a substrate holding mechanism; a brush pushing step for moving a brush made of an elastically deformable material and having a cleaning surface formed in a shape tapered toward one side in a perpendicular direction perpendicular to one surface of the substrate held by the substrate holding mechanism and inclined with respect to the perpendicular direction, and for pushing the cleaning surface of the brush to a peripheral area on the one surface and a peripheral end face of the substrate held by the substrate holding mechanism.

In the brush pushing step, the cleaning surface of the brush is pushed to the peripheral area on the one surface and the peripheral end face of the substrate. Since the cleaning surface of the brush is inclined with respect to a perpendicular direction perpendicular to the one surface of the substrate, the cleaning surface can be pushed securely to the peripheral area on the one surface and the peripheral end face of the substrate by allowing the peripheral portion of the substrate (a portion including the peripheral area on the one surface and the peripheral end face of the substrate) to bite into the cleaning surface. Accordingly, the peripheral area on the one surface and the peripheral end face of the substrate can be cleaned simultaneously.

Furthermore, the effective contact width between the peripheral area on the one surface of the substrate and the cleaning surface can be changed by changing the pushing amount of the brush to the substrate (the amount of elastic deformation of the brush when the cleaning surface of the brush is pushed to the substrate). Therefore, the cleaning width in the peripheral area on the one surface of the substrate can be changed easily by changing the pushing amount of the brush to the substrate.

Moreover, a second object of the present invention is to provide a substrate treatment apparatus and a substrate treatment method capable of properly cleaning the peripheral area on at least one surface and the peripheral end face of a substrate, regardless of the thickness of the substrate.

To attain the second object, a substrate treatment apparatus (hereinafter, in this section referred to as "second substrate treatment apparatus") according to the present invention includes a substrate holding mechanism for holding a substrate; a brush made of an elastically deformable material and having a first cleaning surface formed in a flat shape and a second cleaning surface formed in a shape expanding toward a side opposed to the first cleaning surface, a brush moving mechanism for moving the brush to the substrate held by the substrate holding mechanism; and a control unit for controlling the brush moving mechanism to push the first cleaning surface to a peripheral area on one surface of the substrate held by the substrate holding mechanism and to push the second cleaning surface to a peripheral end face of the substrate.

The first cleaning surface of the brush is pushed to the peripheral area on the one surface of the substrate and the second cleaning surface of the brush is pushed to the peripheral end face of the substrate by controlling the brush moving mechanism. Therefore, the peripheral area on the one surface and the peripheral end face of the substrate can be cleaned simultaneously.

In addition, the pushing amount of the brush to the peripheral area on the one surface of the substrate (the amount of elastic deformation of the brush when the first cleaning surface of the brush is pushed to the peripheral area on the one surface of the substrate) can be made constant by moving the brush to a position corresponding to the thickness of the substrate. Therefore, the pushing force of the brush to the peripheral area on the one surface of the substrate can be obtained securely regardless of the thickness of the substrate, whereby the peripheral area on the one surface of the substrate can be cleaned satisfactorily.

Furthermore, since the first cleaning surface is a flat surface, the pushing force of the brush to the peripheral area on the one surface of the substrate can be made identical over the entire contact portion between the first cleaning surface and the peripheral area on the one surface of the substrate. Therefore, the peripheral area on the one surface of the substrate can be cleaned uniformly.

Furthermore, since the first cleaning surface does not make contact with the area (central area) located more inward than the peripheral area on the one surface of the substrate, the treatment can be carried out while the peripheral area that should be cleaned by the brush is clearly distinguished from the central area that is not required to be cleaned by the brush.

As a result, the accuracy of the cleaning width in the peripheral area on the one surface of the substrate can be raised. In particular, when the central area on the one surface of the substrate is a device area, the cleaning width in the peripheral area on the one surface of the substrate is required to have high accuracy. In the second substrate treatment apparatus, devices are prevented from being damaged by the brush while the cleaning width is obtained securely to the maximum extent.

Moreover, since the second cleaning surface is formed in a shape expanding toward the side opposed to the first cleaning surface, when the second cleaning surface is pushed to the peripheral end face of the substrate, the second cleaning surface is deformed elastically, is bent around the peripheral area on the other surface of the substrate (on the side opposite to the one surface thereof) and makes contact therewith. Therefore, the peripheral area on the one surface and the peripheral end face of the substrate can be cleaned, and at the same time, the peripheral area on the other surface of the substrate can also be cleaned. In other words, the peripheral portion (the peripheral areas on the one surface and the other surface and the peripheral end face) of the substrate can all be cleaned simultaneously, and the cleaning treatment for the peripheral portion of the substrate can be carried out efficiently.

In the case that the central area on the one surface of the substrate is a device area and no device is formed on the other surface of the substrate, the cleaning width in the peripheral area on the one surface of the substrate is required to have high accuracy but the cleaning width in the peripheral area on the other surface of the substrate is not required to have such high accuracy as that on the one surface of the substrate as described above. In such a case, accurate cleaning of the peripheral area on the one surface of the substrate using the first cleaning surface and cleaning of the peripheral area on the other surface of the substrate using the second cleaning surface are effective.

The brush may include a first peripheral end face contact portion expanding toward the side opposed to the first cleaning surface and formed in a generally truncated conical shape having a central axis perpendicular to the first cleaning surface. The first cleaning surface is formed in a generally ring band shape expanding from the peripheral end edge on the small diameter side of the first peripheral end face contact portion in a direction orthogonal to the central axis of the first peripheral end face contact portion. The side surface of the first peripheral end face contact portion is used as the second cleaning surface, whereby the second cleaning surface expanding toward the side opposed to the first cleaning surface can be obtained.

The brush may further include a second peripheral end face contact portion connected to the central portion of the end face of the first peripheral end face contact portion on the large diameter side and formed in a generally truncated conical shape expanding toward the side opposed to the end face of the first peripheral end face contact portion on the large diameter side. In this case, the generally ring band-shaped portion around the central portion of the end face of the first peripheral end face contact portion on the large diameter side is used as a third cleaning surface, and the side surface of the second peripheral end face contact portion is used as a fourth cleaning surface. For example, when the first cleaning surface and the second cleaning surface are worn out by the cleaning of the substrate or when contaminants are accumulated excessively on the first cleaning surface and the second cleaning surface, the third cleaning surface and the fourth cleaning surface can be used, whereby the peripheral areas on the one surface and the other surface and the peripheral end face of the substrate can be cleaned satisfactorily without interruption.

The width of the first cleaning surface may be different from that of the third cleaning surface. In this case, since the width of the first cleaning surface is different from that of the third cleaning surface, the cleaning width in the peripheral area on the one surface of the substrate can be changed easily by selectively using the first cleaning surface and the third cleaning surface.

It is preferable that the brush has a rotationally symmetrical shape and that the substrate treatment apparatus includes a brush rotation mechanism for rotating the brush around the central axis thereof. In this case, the peripheral end face of the substrate can be scrubbed by rotating the brush by the brush rotation mechanism while the fourth cleaning surface of the brush is pushed to the peripheral end face of the substrate. Hence, the peripheral end face of the substrate can be cleaned more satisfactorily.

It is preferable that the brush has a rotationally symmetrical shape and that the substrate treatment apparatus includes a brush rotation mechanism for rotating the brush around the central axis thereof. In this case, the peripheral end face of the substrate can be scrubbed by rotating the brush by the brush rotation mechanism while the second cleaning surface of the brush is pushed to the peripheral end face of the substrate. Hence, the peripheral end face of the substrate can be cleaned more satisfactorily.

It is preferable that the second substrate treatment apparatus includes a brush rotation mechanism for rotating the brush around the axis thereof extending in the perpendicular direction. In this case, the peripheral areas on the one surface and the other surface and the peripheral end face of the substrate can be scrubbed by rotating the brush by the brush rotation mechanism while the cleaning surfaces of the brush are pushed to the peripheral areas on the one surface and the other surface and the peripheral end face of the substrate. Therefore, the peripheral areas on the one surface and the other surface and the peripheral end face of the substrate can be cleaned more satisfactorily.

It is preferable that the second substrate treatment apparatus includes a brush relative movement mechanism for relatively moving the substrate held by the substrate holding mechanism and the brush so that the brush is moved in the circumferential direction of the substrate. In this case, by virtue of the relative movement of the brush and the substrate, the peripheral areas on the one surface and the other surface and the peripheral end face of the substrate can be cleaned efficiently.

It is preferable that the second substrate treatment apparatus includes a treatment liquid supply mechanism for supplying a treatment liquid to an area located more inward than the peripheral area on at least the one surface of the substrate held by the substrate holding mechanism. In this case, contaminants attached to the area located more inward than the peripheral area on the one surface of the substrate can be cleaned away by the treatment liquid. In particular, when the inward area on the one surface of the substrate is a device forming area and a treatment liquid that does not adversely affect the device forming area, for example, pure water or functional water, is used as the treatment liquid, the treatment liquid also acts as a protective liquid. Hence, the contaminants removed from the peripheral portion of the substrate by the brush can be prevented from entering the device forming area. Therefore, the device forming area can be prevented from being polluted by the contaminants.

A substrate treatment method for attaining the second object includes a substrate holding step for holding a substrate using a substrate holding mechanism; a brush pushing step for moving a brush made of an elastically deformable material and having a first cleaning surface formed in a flat shape and a second cleaning surface expanding toward a side opposed to the first cleaning surface, to push the first cleaning surface to a peripheral area on the one surface of the substrate held by the substrate holding mechanism and push the second cleaning surface to a peripheral end face of the substrate.

In the brush pushing step, the first cleaning surface of the brush is pushed to the peripheral area on the one surface of the substrate, and the second cleaning surface of the brush is pushed to the peripheral end face of the substrate. Accordingly, the peripheral area on the one surface and the peripheral end face of the substrate can be cleaned simultaneously.

Moreover, the brush is moved to the position depending on the thickness of the substrate, whereby the pushing amount of the brush to the peripheral area on the one surface of the substrate (the amount of elastic deformation of the brush when the first cleaning surface of the brush is pushed to the peripheral area on the one surface of the substrate) can be made constant. Therefore, the pushing force of the brush to the peripheral area on the one surface of the substrate can be obtained securely regardless of the thickness of the substrate, whereby the peripheral area on the one surface of the substrate can be cleaned satisfactorily.

Furthermore, since the first cleaning surface is a flat surface, the pushing force of the brush to the peripheral area on the one surface of the substrate can be made identical over the entire contact portion between the first cleaning surface and the peripheral area on the one surface of the substrate. Therefore, the peripheral area on the one surface of the substrate can be cleaned uniformly.

Furthermore, since the first cleaning surface does not make contact with the area (central area) located more inward than the peripheral area on the one surface of the substrate, the treatment can be carried out while the peripheral area that should be cleaned by the brush is clearly distinguished from the central area that is not required to be cleaned by the brush. In particular, in the case that the central area on the one surface of the substrate is a device area, devices are prevented from being damaged by the brush.

Moreover, since the second cleaning surface is formed in a shape expanding toward the side opposed to the first cleaning surface, when the second cleaning surface is pushed to the peripheral end face of the substrate, the second cleaning surface is deformed elastically, is bent around the peripheral area on the other surface of the substrate (on the side opposite to the one surface thereof) and makes contact therewith. Consequently, the peripheral area on the one surface and the peripheral end face of the substrate can be cleaned, and at the same time, the peripheral area on the other surface of the substrate can also be cleaned.

The above-mentioned and other objects, features and effects of the present invention will become apparent from the following detailed description of embodiments with reference to the accompanying drawings.

DETAILED DESCRIPTION OF THE PREFERRED EMBODIMENTS

Embodiments according to the present invention will be described below in detail referring to the accompanying drawings.

Figure 1:
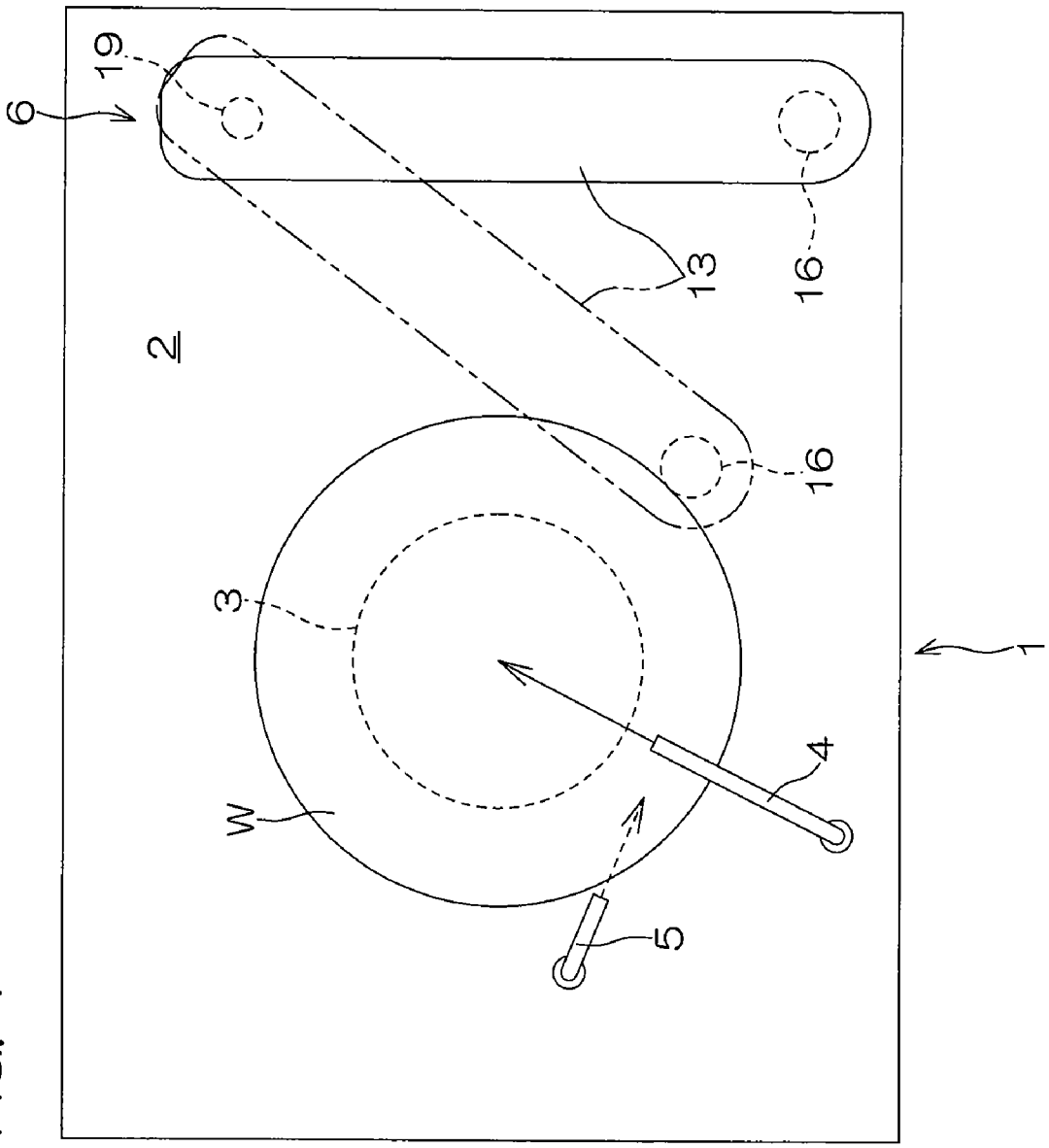
FIG. 1 is a plan view showing the schematic configuration of a substrate treatment apparatus according to a first embodiment of the present invention.
Figure 2:
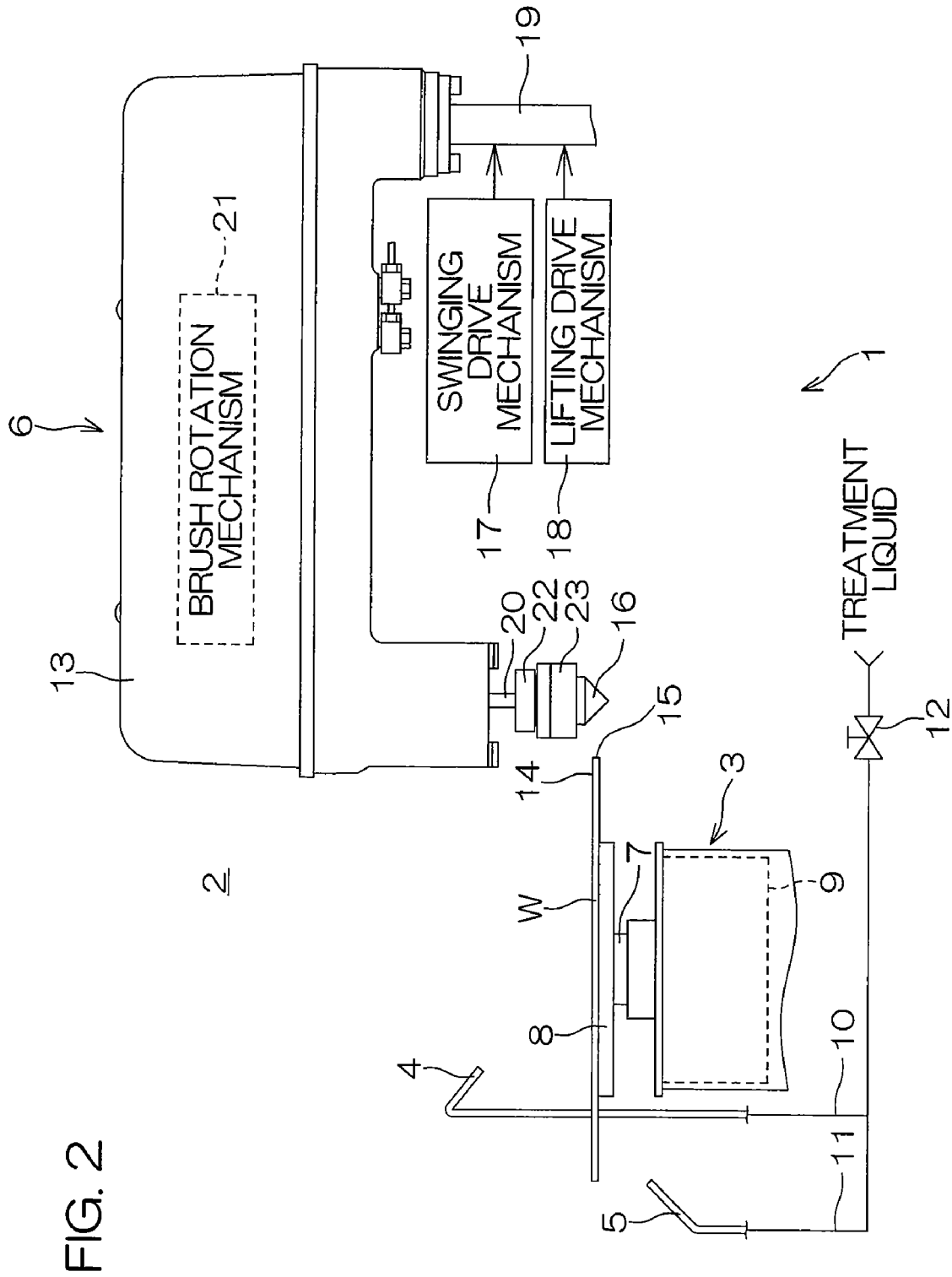
FIG. 2 is an illustrative side view showing the interior of the substrate treatment apparatus shown in FIG. 1.

FIG. 1 is a plan view showing the schematic configuration of a substrate treatment apparatus according to an embodiment of the present invention. FIG. 2 is an illustrative side view showing the interior of the substrate treatment apparatus shown in FIG. 1.

This substrate treatment apparatus 1 is of a single wafer processing type for processing semiconductor wafers W (hereinafter referred to simply as "wafer W") as an example of a substrate one by one. The substrate treatment apparatus 1 includes a spin chuck 3 for holding a wafer W generally horizontally and rotating it, a front surface nozzle 4 for supplying a treatment liquid to the front surface (the surface on which devices are formed: upper surface in the present embodiments) of the wafer W, aback surface nozzle 5 for supplying a treatment liquid to the back surface of the wafer W: lower surface in the present embodiments), and a brushing mechanism 6 for cleaning the peripheral portion of the wafer W, inside a treatment chamber 2 divided by a partition wall.

The spin chuck 3 is a vacuum suction chuck. The spin chuck 3 includes a spin shaft 7 extending in a generally vertical direction, a suction base 8 mounted to the upper end of the spin shaft 7 for sucking and holding the back surface (lower surface) of the wafer W in a generally horizontal posture, and a spin motor 9 having a rotation shaft coaxially connected to the spin shaft 7. With this configuration, when the spin motor 9 is driven while the back surface of the wafer W is sucked and held by the suction base 8, the wafer W is rotated around the central axis of the spin shaft 7.

Treatment liquid supply pipes 10 and 11 are connected to the front surface nozzle 4 and the back surface nozzle 5, respectively. To these treatment liquid supply pipes 10 and 11, a treatment liquid is supplied from a treatment liquid supply source not shown via a treatment liquid valve 12. The front surface nozzle 4 discharges the treatment liquid supplied through the treatment liquid supply pipe 10 toward the center of the front surface of the wafer W held by the spin chuck 3. In addition, the back surface nozzle 5 discharges the treatment liquid supplied through the treatment liquid supply pipe 11 toward the area between the peripheral end edge of the back surface of the wafer W held by the spin chuck 3 and the suction base 8.

Pure water is used as the treatment liquid. Instead of pure water, it may be possible to use functional water such as carbonated water, ionized water, ozone water, regenerated water (hydrogen water) or magnetic water, as the treatment liquid. Furthermore, it is also possible to use a chemical liquid, such as ammonia water, or a mixture of ammonia water and a hydrogen peroxide solution, as the treatment liquid.

The brushing mechanism 6 includes a swinging arm 13 disposed above the position of the wafer W held by the spin chuck 3 and extending generally horizontally; a brush 16, held at the tip end of this swinging arm 13, for cleaning a peripheral area 14 (for example, a ring-shaped area with a width of 1 to 4 mm from the peripheral end edge of the wafer W) on the front surface and a peripheral end face 15 of the wafer W; a swinging drive mechanism 17 for swinging the swinging arm 13 in the horizontal direction around the vertical axis set outside the rotation range of the wafer W; and a lifting drive mechanism 18 for raising and lowering the swinging arm 13.

The peripheral portion of the wafer W is a portion including the peripheral area 14 on the front surface and the peripheral end face 15 of the wafer W.

To the base end portion of the swinging arm 13, the upper end portion of an arm supporting shaft 19 extending in the vertical direction is connected. To this arm supporting shaft 19, the drive force of the swinging drive mechanism 17 is input. The swinging arm 13 can be swung around the arm supporting shaft 19 by inputting the drive force of the swinging drive mechanism 17 to the arm supporting shaft 19 and reciprocally rotating the arm supporting shaft 19. Furthermore, to the arm supporting shaft 19, the lifting drive mechanism 18 is connected. The swinging arm 13 can be raised and lowered together with the arm supporting shaft 19 by raising and lowering the arm supporting shaft 19 using the lifting drive mechanism 18.

By the tip end portion (distal end portion) of the swinging arm 13, a brush rotation shaft 20 is held rotatably. This brush rotation shaft 20 extends in the vertical direction and passes through the lower surface of the tip end portion of the swinging arm 13. Inside the swinging arm 13, a brush rotation mechanism 21 for rotating the brush rotation shaft 20 is connected to the brush rotation shaft 20. On the other hand, to the lower end portion of the brush rotation shaft 20, a holder mounting portion 22 is fixed. To this holder mounting portion 22, the brush 16 is mounted via a brush holder 23.

Figure 3:
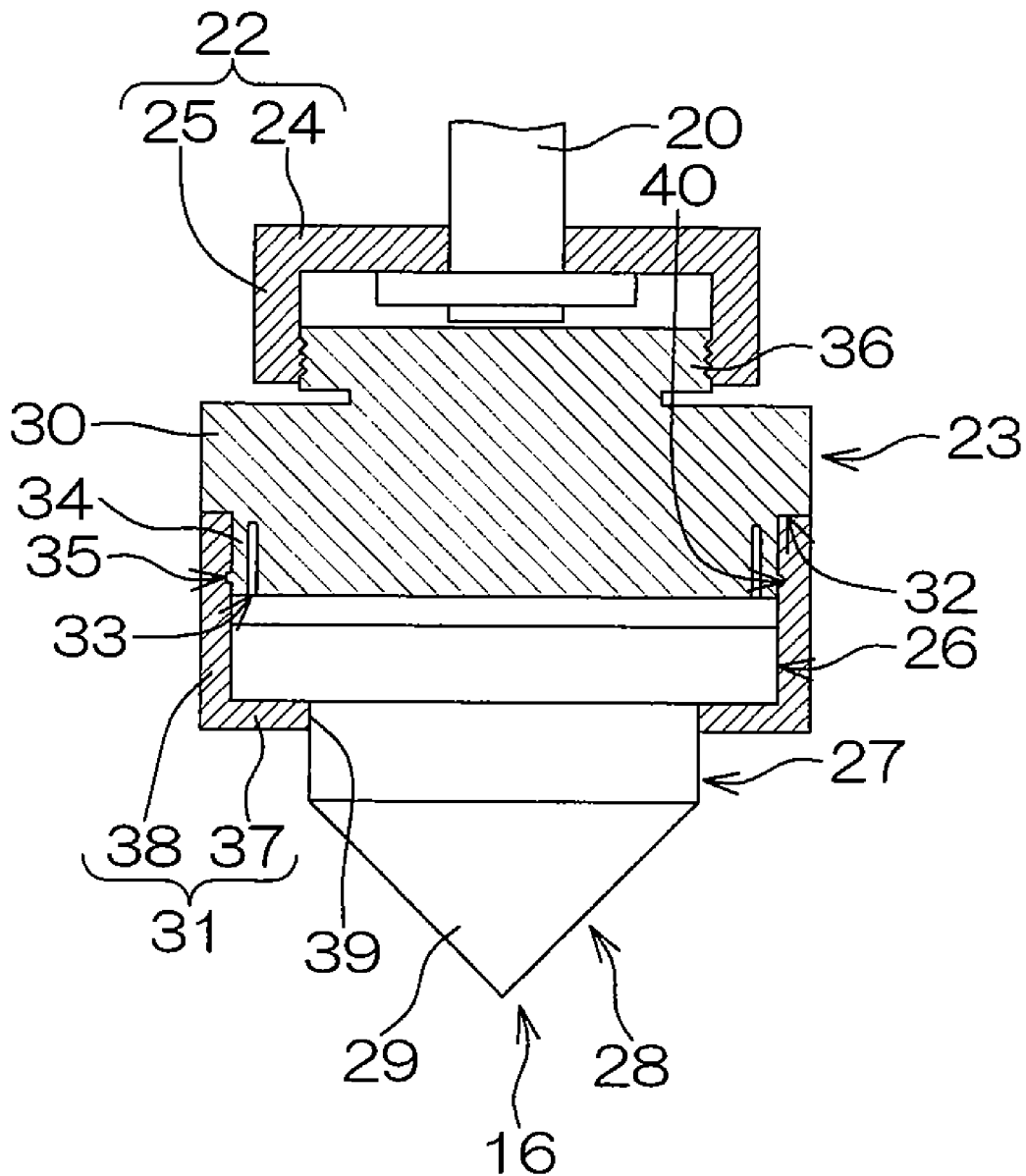
FIG. 3 is a sectional view showing the holder mounting portion, the brush and the brush holder shown in FIG. 2.

FIG. 3 is a sectional view showing the configurations of the brush 16 and the brush holder 23.

The holder mounting portion 22 integrally includes a disc-like upper surface portion 24, through the center of which the brush rotation shaft 20 is inserted and which is fixed to the brush rotation shaft 20, and a cylindrical side surface portion 25 extending downward from the peripheral edge of this upper surface portion 24. On the inner circumferential surface of the side surface portion 25, a screw thread is formed which can be screw-engaged with the screw thread formed in the screw portion 36 of the brush holder 23, the screw portion 36 being described later.

The brush 16 is made of a sponge material (porous material) formed of an elastically deformable material, such as PVA (polyvinyl alcohol) and urethane. The brush 16 integrally includes a base portion 26 having a generally disc-like shape, a body portion 27 provided on one face of this base portion 26 and having a generally disc-like shape (flat cylindrical shape) the diameter of which is smaller than that of the base portion 26, and a tip end portion 28 provided at the tip end of this body portion 27 and having a generally conical shape. The base portion 26, the body portion 27 and the tip end portion 28 have the same central axis. The brush 16 has a shape being rotationally symmetrical around the central axis thereof. The upper end edge of the side surface of the tip end portion 28 is continuous with the side surface of the body portion 27. The side surface of the tip end portion 28 is a conical surface inclined at an inclination angle of 45 degrees with respect to the vertical direction (the central axis) so as to come closer to the central axis as it approaches the lower portion of itself. The side surface of the tip end portion 28 serves as a cleaning surface 29 that is pushed to the peripheral area 14 and the peripheral end face 15 of the surface of the wafer W.

The brush holder 23 includes a resin block 30 having a generally columnar shape; and a fixing member 31 for fixing the brush 16 to this resin block 30.

A fitting groove 32 having a generally rectangular shape in section is formed around the entire circumference of the circumferential surface of one end portion of the resin block 30. In addition, on the one end portion of the resin block 30, a slit groove 33 having a generally U shape in section is formed in the circumferential direction at a position spaced away from the fitting groove 32 with a very small distance inward in the radial direction. With this configuration, the portion between the fitting groove 32 and the slit groove 33 serves as an elastic piece 34 to which the elasticity due to the flexibility of the resin is given. On the outer circumferential surface of this elastic piece 34, a plurality of hemispherical engaging protrusions 35 are formed. On the other hand, on the end surface on the other side of the resin block 30, a flat columnar screw portion 36 is formed integrally. On the circumferential surface of this screw portion 36, a screw is formed which can be screw-engaged with the screw thread formed in the holder mounting portion 22 described later.

The fixing member 31 integrally includes a disc portion 37 having a generally circular outer shape and a cylindrical portion 38 having a generally cylindrical shape and extending from the peripheral edge of this disc portion 37 to one side thereof. At the central portion of the disc portion 37, an insertion hole 39 for allowing the body portion 27 of the brush 16 to insert there through is formed. The inner diameter of the cylindrical portion 38 is generally equal to the outer diameter of the base portion 26 of the brush 16. In addition, the inner diameter of the cylindrical portion 38 is made slightly smaller than the outer diameter of the elastic piece 34 when no external force is applied to the elastic piece 34. Further, on the inner circumferential surface of the cylindrical portion 38, a plurality of engaging concave portions 40 that can be engaged with the respective engaging protrusions 35 are formed.

The body portion 27 of the brush 16 is inserted through the insertion hole 39 of the fixing member 31, the base portion 26 is accommodated inside the cylindrical portion 38, the cylindrical portion 38 is fitted in the fitting groove 32 of the resin block 30, and the engaging protrusions 35 are engaged with the respective engaging concave portions 40, whereby the brush 16 is held by the brush holder 23. Then, the screw portion 36 of the brush holder 23 is screw-engaged with the holder mounting portion 22, whereby the brush 16 is mounted to the holder mounting portion 22.

Figure 4:
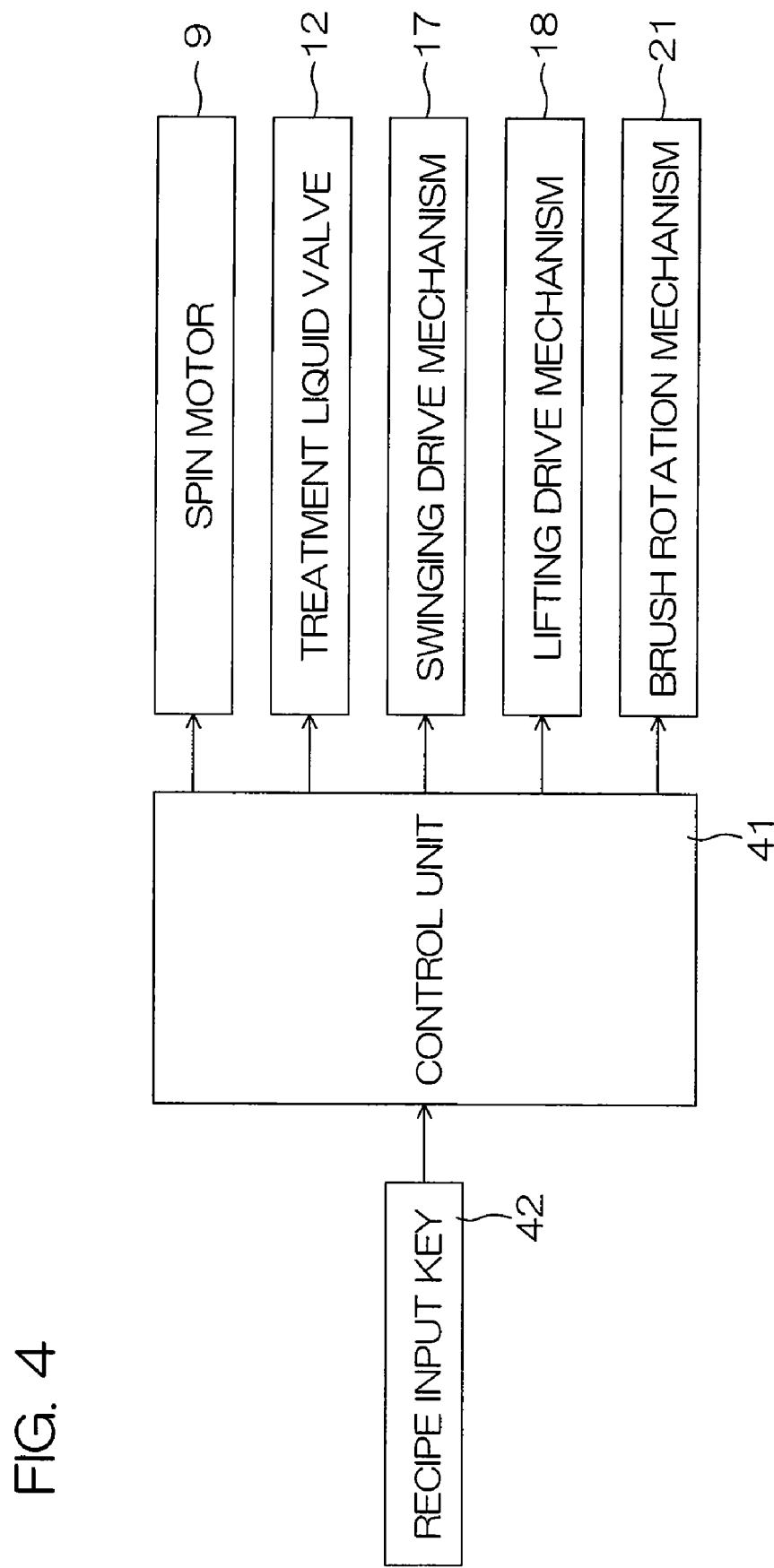
FIG. 4 is a block diagram illustrating the electrical configuration of the substrate treatment apparatus shown in FIG.

FIG. 4 is a block diagram illustrating the electrical configuration of the substrate treatment apparatus 1.

The substrate treatment apparatus 1 includes a control unit 41 including a microcomputer. To this control unit 41, a recipe input key 42 for allowing the user to input a treatment recipe (various conditions for treating the wafer W) is connected. Furthermore, to the control unit 41, the spin motor 9, the treatment liquid valve 12, the swinging drive mechanism 17, the lifting drive mechanism 18, the brush rotation mechanism 21, etc., are connected as objects to be controlled.

Figure 5:
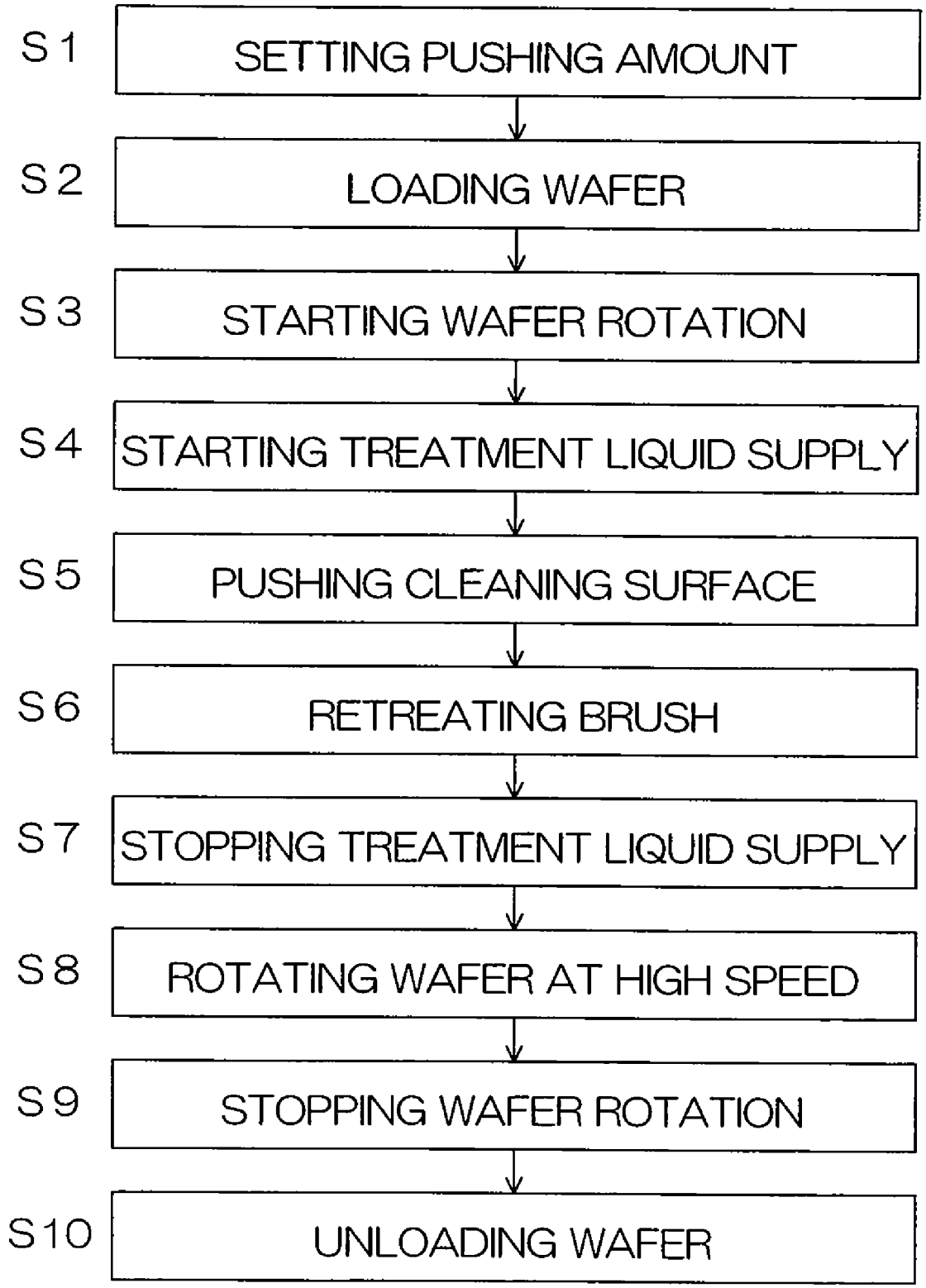
FIG. 5 is a process chart for explaining the wafer treatment in the substrate treatment apparatus shown in FIG. 1.
Figure 6:
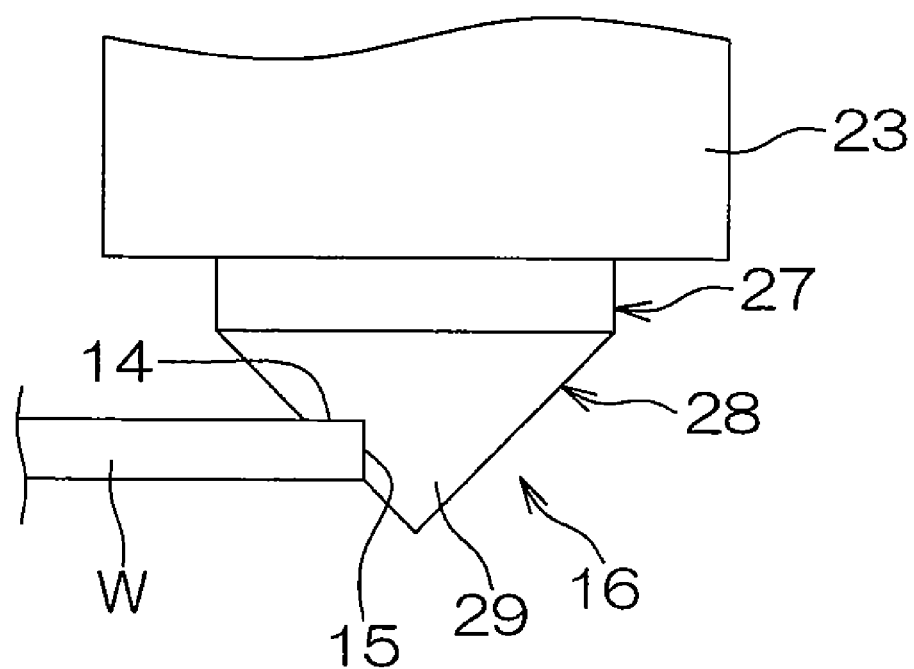
FIG. 6 is a side view showing a state of the brush during the wafer treatment in the substrate treatment apparatus shown in FIG. 1.

FIG. 5 is a process chart for explaining the treatment of the wafer W in the substrate treatment apparatus 1. FIG. 6 is a side view showing the state of the brush 16 during the treatment of the wafer W.

Before the wafer W is treated, the recipe input key 42 is operated by the user, and the pushing amount of the brush 16 to the peripheral end face of the wafer W is set (step S1). The pushing amount is the elastic deformation amount of the brush 16 when the cleaning surface 29 of the brush 16 is pushed to the peripheral end face 15 of the wafer W. More specifically, the pushing amount is the displacement amount of the brush 16 from the state in which the brush 16 is in contact with the peripheral end face 15 of the wafer W to the state in which the brush 16 is displaced toward the wafer W while being elastically deformed. For example, the pushing amount is set at 1 to 4 mm.

The wafer W loaded into the treatment chamber 2 is held by the spin chuck 3 (step S2). Then, the spin motor 9 is controlled by the control unit 41, and the rotation of the wafer W by the spin chuck 3 is started (step S3). The wafer W is rotated at a rotation speed of 100 rpm, for example. Next, the treatment liquid valve 12 is opened by the control unit 41, and the supply of the treatment liquid from the front surface nozzle 4 and the back surface nozzle 5 to the front surface and the back surface of the wafer W, respectively, is started (step S4).

In addition, the brush rotation mechanism 21 is controlled by the control unit 41, and the brush 16 is rotated in the same rotation direction as that of the wafer W at a rotation speed of 100 to 200 rpm, for example. Then, the swinging drive mechanism 17 and the lifting drive mechanism 18 are controlled by the control unit 41, and the cleaning surface 29 of the brush 16 is pushed to the peripheral area 14 on the front surface and the peripheral end face 15 of the wafer W (step S5). More specifically, first, the lifting drive mechanism 18 is controlled, and the brush 16 is moved to a predetermined height position. By virtue of this movement, the cleaning surface 29 of the brush 16 is opposed to the peripheral end face 15 of the wafer W. Next, the swinging drive mechanism 17 is controlled on the basis of the pushing amount set using the recipe input key 42, the swinging arm 13 is swung, and the brush 16 is moved horizontally. By virtue of this horizontal movement, the peripheral portion of the wafer W bites into the cleaning surface 29 of the brush 16, and the cleaning surface 29 of the brush 16 is pushed to the peripheral area 14 on the front surface and the peripheral end face 15 of the wafer W as shown in FIG. 6. At this time, since the cleaning surface 29 of the brush 16 has an inclination angle of 45 degrees with respect to the central axis thereof, the cleaning surface 29 makes contact with the peripheral area 14 on the front surface of the wafer W at a width generally equal to the pushing amount set using the recipe input key 42. Accordingly, the cleaning surface 29 can clean the peripheral area 14 on the front surface of the wafer W at the cleaning width corresponding to the pushing amount set using the recipe input key 42 while being capable of cleaning the peripheral end face 15 of the wafer W.

Furthermore, while the peripheral area 14 on the front surface and the peripheral end face 15 of the wafer W are cleaned as described above, contaminants attached to the central area (device forming area) located more inward than the peripheral area 14 on the front surface of the wafer W can be cleaned away by the treatment liquid supplied to the front surface of the wafer W. In addition, pure water serving as the treatment liquid also serves as a protective liquid for preventing the contaminants removed from the peripheral area 14 and the peripheral end face 15 by the brush 16 from entering the central area (device forming area) on the front surface of the wafer W. When the treatment liquid is used as a protective liquid, it is preferable to select a treatment liquid that does not adversely affect the device forming area on the front surface of the wafer W, for example, carbonated water, ionized water, regenerated water (hydrogen water), or functional water such as magnetic water, in addition to pure water.

When a predetermined time has passed after the cleaning surface 29 of the brush 16 is pushed to the peripheral portion of the wafer W, the swinging drive mechanism 17 and the lifting drive mechanism 18 are controlled by the control unit 41, and the brush 16 is retreated to its home position at which the brush 16 is located before the start of the treatment (step S6). In addition, while the brush 16 is returned to its home position, the drive of the brush rotation mechanism 21 is stopped, and the rotation of the brush 16 is stopped. Furthermore, the treatment liquid valve 12 is closed by the control unit 41, and the supply of the treatment liquid from the front surface nozzle 4 and the back surface nozzle 5 is stopped (step S7).

Then, the spin motor 9 is controlled by the control unit 41, and the wafer W is rotated at a high speed (for example, 3000 rpm) (step S8). Hence, the treatment liquid attached to the wafer W is spun off, and the wafer W can be dried.

After the high-speed rotation of the wafer W is continued for a predetermined time, the spin motor 9 is stopped, and the rotation of the wafer W by the spin chuck 3 is stopped (step S9). Then, after the wafer W becomes stationary, the wafer W having been treated is unloaded from the treatment chamber 2 (step S10).

After the treatment in the substrate treatment apparatus 1, the back surface of the wafer W is cleaned in another substrate treatment apparatus (treatment chamber) to remove contaminants (suction traces) attached to the contact portion between the back surface of the wafer W and the suction base 8 of the spin chuck 3.

As described above, the cleaning surface 29 of the brush 16 is pushed to the peripheral area 14 on the front surface and the peripheral end face 15 of the wafer W, whereby the simultaneous cleaning the peripheral area 14 and the peripheral end face 15 can be achieved. Since the cleaning surface 29 of the brush 16 is inclined with respect to the vertical direction, the cleaning surface 29 can be pushed securely to the peripheral area 14 on the front surface and the peripheral end face 15 of the wafer W by allowing the peripheral portion of the wafer W held generally horizontally by the spin chuck 3 to bite into the cleaning surface 29. Consequently, the peripheral area 14 on the front surface and the peripheral end face 15 of the wafer W can be cleaned satisfactorily.

Moreover, the effective contact width between the peripheral area 14 on the front surface of the wafer W and the cleaning surface 29 of the brush 16 can be changed by changing the pushing amount of the brush 16 to the wafer W through operation of the recipe input key 42. Therefore, the cleaning width in the peripheral area 14 on the front surface of the wafer W can be changed easily by changing the pushing amount of the brush 16 to the wafer W.

Furthermore, the tip end portion 28 of the brush 16 is formed in a generally conical shape. Since the side surface of the tip end portion 28 serves as the cleaning surface 29, the cleaning surface 29 is inclined at a constant angle with respect to the vertical direction (the central axis of the tip end portion 28). Therefore, the effective contact width between the peripheral area 14 on the front surface of the wafer W and the cleaning surface 29 (the cleaning width by the brush 16) becomes the same when the pushing amount of the brush 16 is the same, regardless of into which area of the cleaning surface 29 the peripheral portion of the wafer W is allowed to bite. Consequently, when a partial area of the cleaning surface 29 is worn out by the cleaning of the wafer W or when contaminants are accumulated excessively in a partial area of the cleaning surface 29 to the extent that the cleaning of the wafer W is hindered, the other area of the cleaning surface 29 is used, whereby the peripheral area 14 on the front surface and the peripheral end face 15 of the wafer W can be cleaned satisfactorily without interruption.

In addition, while the cleaning surface 29 of the brush 16 is pushed to the wafer W, the wafer W is rotated by the spin chuck 3, and the brush 16 and the peripheral portion of the wafer W are moved relatively, whereby the peripheral portion of the wafer W can be cleaned efficiently.

Furthermore, while the cleaning surface 29 of the brush 16 is pushed to the wafer W, the brush 16 is rotated in the same direction as that of the wafer W. Accordingly, the peripheral portion of the wafer W can be scrubbed, and the peripheral portion of the wafer W can be cleaned more satisfactorily. The rotation direction of the brush 16 may be opposite to the rotation direction of the wafer W. However, when the rotation direction is the same as that of the wafer W, the wafer W and the brush 16 can be rubbed with each other. Therefore, cleaning with a higher quality can be attained.

In this embodiment, after the brush 16 is moved to the predetermined height position, the brush 16 is moved horizontally, whereby the cleaning surface 29 of the brush 16 is pushed to the peripheral area 14 on the front surface and the peripheral end face 15 of the wafer W in the lateral direction (from the side of the wafer W). However, the order of the up/down movement and the horizontal movement of the brush 16 may be reversed. In other words, it may be possible that the swinging drive mechanism 17 is controlled, the swinging arm 13 is swung, and the brush 16 is moved horizontally, whereby the cleaning surface 29 of the brush 16 is disposed at a position opposed to the peripheral area 14 on the front surface of the wafer W, and then, the lifting drive mechanism 18 is controlled on the basis of the pushing amount set using the recipe input key 42 and the brush 16 is moved down, whereby the peripheral portion of the wafer W bites into the cleaning surface 29 of the brush 16, and the cleaning surface 29 of the brush 16 is pushed to the peripheral area 14 on the front surface and the peripheral end face 15 of the wafer W in the vertical direction (from the side of the front surface of the wafer W, that is, from above). Even in this case, the cleaning surface 29 of the brush 16 makes contact with the peripheral area 14 on the front surface of the wafer W with a contact width generally equal to the pushing amount set using the recipe input key 42.

Figure 7:
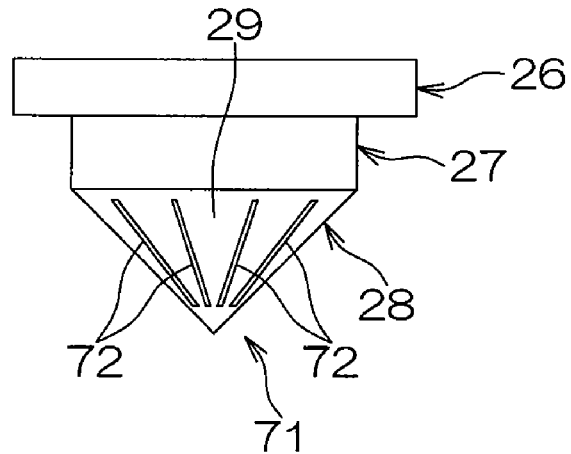
FIG. 7 is a side view showing another configuration of the brush (where grooves are formed in the cleaning surface) for use in the substrate treatment apparatus shown in FIG. 1.

FIG. 7 is a side view showing another configuration of the brush for use in the substrate treatment apparatus 1. In FIG. 7, components corresponding to the components shown in FIG. 3 are designated using the same reference numerals as those of the components shown in FIG. 3. Furthermore, detailed descriptions of the components designated using the same reference numerals are omitted below.

A plurality of grooves 72 are formed in the cleaning surface 29 of a brush 71 shown in FIG. 7. The grooves 72 extend linearly along the generating lines of the cleaning surface 29 formed as a cone surface.

Since the grooves 72 are formed in the cleaning surface 29 of the brush 71 as described above, contaminants relatively firmly attached to the peripheral area 14 on the front surface and the peripheral end face 15 of the wafer W can be scraped off by the brush 71. Furthermore, the contaminants scraped off from the wafer W by the brush 71 can be removed through the grooves from the space between the cleaning surface 29 and the wafer W. Therefore, the peripheral area 14 on the front surface and the peripheral end face 15 of the wafer W can be cleaned more satisfactorily by the brush 71 shown in FIG. 7.

The grooves 72 are not limited to ones having the linear shape formed along the generating line of the cleaning surface 29. The grooves 72 may have a ring shape formed along the circumference of the cleaning surface 29. Alternatively, only one groove 72 may also be formed. When only one groove 72 is formed, the groove 72 may be formed in a spiral shape.

Figure 8:
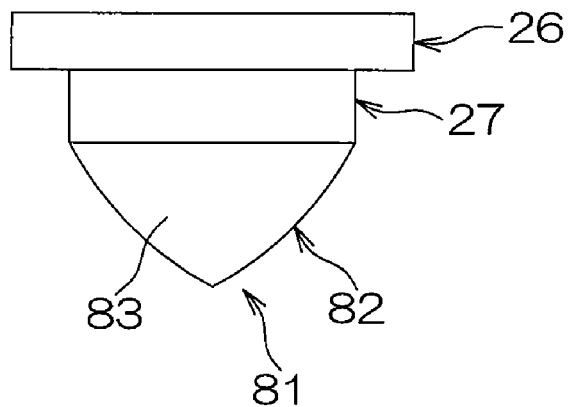
FIG. 8 is a side view showing still another configuration of the brush (where the cleaning surface has a curved shape swelling outward) for use in the substrate treatment apparatus shown in FIG. 1.

FIG. 8 is a side view showing still another configuration of the brush for use in the substrate treatment apparatus 1. In FIG. 8, components corresponding to the components shown in FIG. 3 are designated using the same reference numerals as those of the components shown in FIG. 3. Furthermore, detailed descriptions of the components designated using the same reference numerals are omitted below.

A tip end portion 82 of a brush 81 shown in FIG. 8 is formed in a generally conical shape tapered downward and having a curved side surfaces welling outward. The side surface of the tip end portion 82 serves as a cleaning surface 83 that is pushed to the peripheral area 14 on the front surface and the peripheral end face 15 of the wafer W. Therefore, in the brush 81, the inclination angle with respect to the vertical direction (central axis) is different depending on the position in the direction of the generating line of the cleaning surface 83.

With this configuration, the peripheral area 14 on the front surface and the peripheral end face 15 of the wafer W can be cleaned more satisfactorily by changing the position of the contact between the wafer W and the cleaning surface 83 in the direction of the generating line of the cleaning surface 83 while the peripheral portion of the wafer W is allowed to bite into the cleaning surface 83 of the brush 81. In other words, when the peripheral portion of the wafer W bites into an area of the cleaning surface 83 of the brush 81 in which the inclination angle thereof with respect to the vertical direction (in a perpendicular direction perpendicular to the front surface of the wafer W) is small, the cleaning surface 83 can be made contact with the peripheral end face 15 of the wafer W securely, and the peripheral end face 15 can be cleaned satisfactorily. When the peripheral portion of the wafer W bites into an area of the cleaning surface 83 of the brush 81 in which the inclination angle thereof with respect to the vertical direction is large, the cleaning surface 83 can be made contact with the peripheral area 14 on the front surface of the wafer W securely, and the peripheral area 14 can be cleaned satisfactorily.

Figure 9:
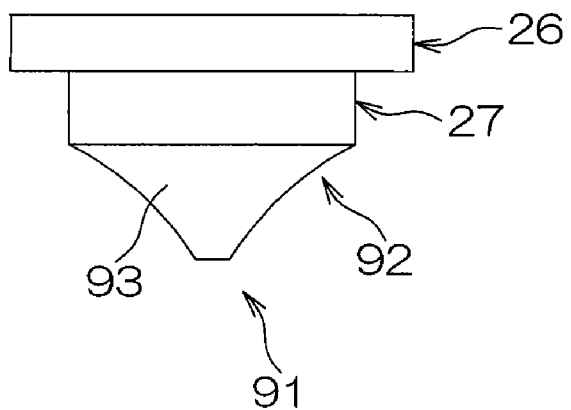
FIG. 9 is a side view showing still another configuration of the brush (where the cleaning surface has a curved shape recessed inward) for use in the substrate treatment apparatus shown in FIG. 1.

FIG. 9 is a side view showing still another configuration of the brush for use in the substrate treatment apparatus 1. In FIG. 9, components corresponding to the components shown in FIG. 3 are designated using the same reference numerals as those of the components shown in FIG. 3. Furthermore, detailed descriptions of the components designated using the same reference numerals are omitted below.

A tip end portion 92 of a brush 91 shown in FIG. 9 is formed into a generally conical shape tapered downward and having a curved side surface recessed inward. The side surface of the tip end portion 92 serves as a cleaning surface 93 that is pushed to the peripheral area 14 and the peripheral end face 15 of the wafer W. Therefore, with the brush 91, the inclination angle with respect to the vertical direction (central axis) is different depending on the position in the direction of the generating line of the cleaning surface 93.

With this configuration, the peripheral area 14 on the front surface and the peripheral end face 15 of the wafer W can be cleaned more satisfactorily by changing the position of the contact between the wafer W and the cleaning surface 93 in the direction of the generating line of the cleaning surface 93 while the peripheral portion of the wafer W is allowed to bite into the cleaning surface 93 of the brush 91. In other words, when the peripheral portion of the wafer W bites into an area of the cleaning surface 93 of the brush 91 in which the inclination angle thereof with respect to the vertical direction is small, the cleaning surface 93 can be made contact with the peripheral end face 15 of the wafer W securely, and the peripheral end face 15 can be cleaned satisfactorily. When the peripheral portion of the wafer W bites into an area of the cleaning surface 93 of the brush 91 in which the inclination angle thereof with respect to the vertical direction is large, the cleaning surface 93 can be made contact with the peripheral area 14 on the front surface of the wafer W securely, and the peripheral area 14 can be cleaned satisfactorily.

Figure 10:
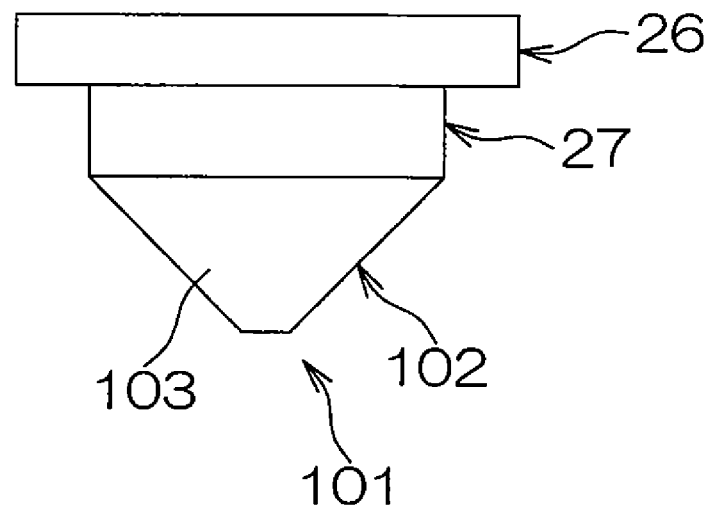
FIG. 10 is a side view showing still another configuration of the brush (where the tip end portion is formed in a generally truncated conical shape) for use in the substrate treatment apparatus shown in FIG. 1.

FIG. 10 is a side view showing still another configuration of the brush for use in the substrate treatment apparatus 1. In FIG. 10, components corresponding to the components shown in FIG. 3 are designated using the same reference numerals as those of the components shown in FIG. 3. Furthermore, detailed descriptions of the components designated using the same reference numerals are omitted below.

A tip end portion 102 of a brush 101 shown in FIG. 10 is formed in a generally truncated conical shape rotationally symmetrical around the central axis thereof being common to the base portion 26 and the body portion 27. The upper end edge of the side surface of the tip end portion 102 is continuous with the side surface of the body portion 27, and the side surface of the tip end portion 102 is inclined at an inclination angle of 45 degrees with respect to the vertical direction (central axis) so as to come closer to the central axis as it approaches the lower portion of itself. The side surface of the tip end portion 102 serves as a cleaning surface 103 that is pushed to the peripheral area 14 on the front surface and the peripheral end face 15 of the wafer W.

With this configuration, it is also possible to obtain effects similar to those of the brush 16 shown in FIG. 3. In other words, since the cleaning surface 103 of the brush 101 is inclined with respect to the vertical direction, the cleaning surface 103 can be pushed to the peripheral area 14 on the front surface and the peripheral end face 15 of the wafer W securely by allowing the peripheral portion of the wafer W held generally horizontally by the spin chuck 3 to bite into the cleaning surface 103. Therefore, the peripheral area 14 on the front surface and the peripheral end face 15 of the wafer W can be cleaned satisfactorily.

<Cleaning Test>

Figure 12:
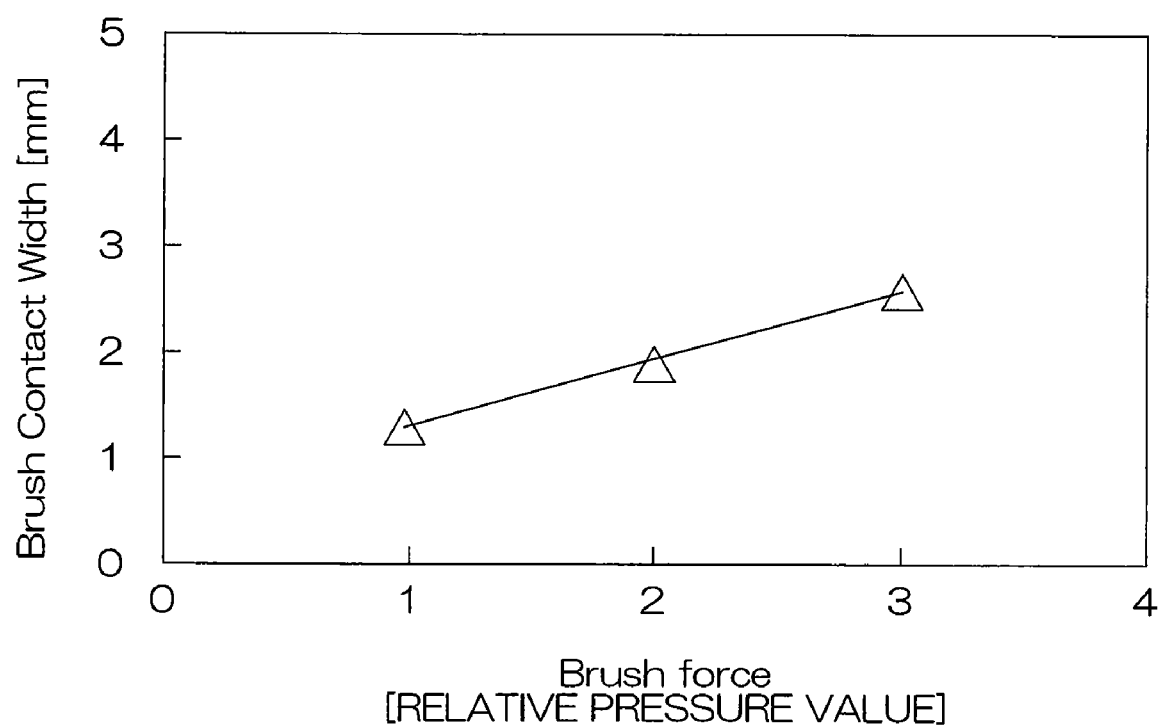
FIG. 12 is a graph showing the relationship between the pushing pressure of the brush for use in the substrate treatment apparatus shown in FIG. 1 and the contact width of the brush in the peripheral area on the front surface of a wafer.

FIG. 12 is a graph showing the relationship between the pushing pressure of the brush 16 and the contact width of the brush 16 in the peripheral area 14 on the front surface of the wafer W.

The inventors of the present application conducted a test for examining the relationship between the pushing pressure of the brush 16 and the contact width of the brush 16 in the peripheral area 14 on the front surface of the wafer W. In this test, the brush 16 was soaked in photoresist and pushed to the peripheral portion of the wafer W at a predetermined pushing pressure. Then, the width of the photoresist attached to the peripheral area 14 on the front surface of the wafer W was measured. The inclination angle of the cleaning surface 29 of the brush 16 is 45 degrees as described above. The results of the test are represented by the line graph shown in FIG. 12.

In other words, when the pushing pressure of the brush 16 was 1 [a relative pressure value], the contact width of the brush 16 in the peripheral area 14 on the front surface of the wafer W was approximately 1.2 mm. When the pushing pressure of the brush 16 was 2 [a relative pressure value], the contact width of the brush 16 in the peripheral area 14 on the front surface of the wafer W was approximately 1.8 mm. When the pushing pressure of the brush 16 was 3 [a relative pressure value], the contact width of the brush 16 in the peripheral area 14 on the front surface of the wafer W was approximately 2.4 mm. The relative pressure value is herein defined as a relative pressure value obtained when it is assumed that the predetermined pressure value of the pushing pressure is 1.

According to the results, it is understood that the pushing pressure of the brush 16 and the contact width of the brush 16 have a generally directly proportional relationship. Therefore, it is also understood that the cleaning width in the peripheral area 14 on the front surface of the wafer W can be controlled satisfactorily depending on the pushing pressure (pushing amount) of the brush 16.

In this first embodiment, a configuration for cleaning the peripheral area 14 on the front surface and the peripheral end face 15 of the wafer W held by the spin chuck 3 is described. However, a peripheral area 112 on the back surface and the peripheral end face 15 of the wafer W can also be cleaned by a brush 111 shown in FIG. 11.

A tip end portion 113 of the brush 111 is formed in a generally truncated conical shape tapered toward the body portion 27 thereof (upward), and the side surface of the tip end portion 113 serves as a cleaning surface 114 that is pushed to the peripheral area 14 on the front surface and the peripheral end face 15 of the wafer W. The upper end edge of this cleaning surface 114 is continuous with the side surface of the body portion 27, and the cleaning surface 114 is inclined at an inclination angle of 45 degrees, for example, with respect to the vertical direction (central axis) so as to be spaced away from the central axis thereof as it approaches the lower portion of itself. Therefore, the cleaning surface 114 can be pushed securely to the peripheral area 112 on the back surface and the peripheral end face 15 of the wafer W by allowing the peripheral portion of the wafer W held generally horizontally by the spin chuck 3 to bite into the cleaning surface 114. Accordingly, the peripheral area 112 on the back surface and the peripheral end face 15 of the wafer W can be cleaned satisfactorily. Furthermore, when the brush 111 is used and pushed to the peripheral area 112 on the back surface and the peripheral end face 15 of the wafer W, the brush 111 may be pushed in the lateral direction (from the side of the wafer W) or in the vertical direction (from the side of the back surface of the wafer W, that is, from below).

Figure 11:
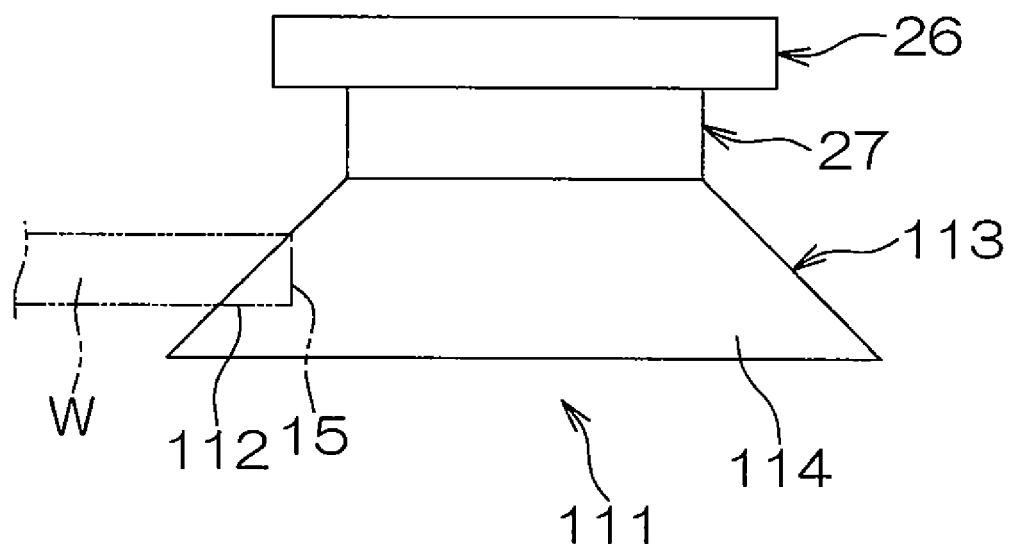
FIG. 11 is a side view showing still another configuration of the brush (the tip end portion is formed in a generally truncated conical shape tapered upward) for use in the substrate treatment apparatus shown in FIG. 1.

In FIG. 11, components corresponding to the components shown in FIG. 3 are designated using the same reference numerals as those of the components shown in FIG. 3. Furthermore, detailed descriptions of the components designated using the same reference numerals are omitted below.

In addition, it may also be possible that the configurations of the above-mentioned brushes 16, 71, 81, 91, 101 and 111 are combined appropriately. For example, it may also be possible that grooves similar to the grooves 72 formed in the cleaning surface 29 of the brush 71 are formed in the cleaning surface 83 of the brush 81, the cleaning surface 93 of the brush 91, the cleaning surface 103 of the brush 101 or the cleaning surface 114 of the brush 111.

Furthermore, although the cleaning surfaces 29, 103 and 114 have an inclination angle of 45 degrees with respect to the vertical direction, the inclination angle of the cleaning surfaces 29, 103 and 114 with respect to the vertical direction may be set in the range of 5 to 85 degrees. It is preferable that the inclination angle is set in the range of 30 to 60 degrees to prevent the wafer W from being deformed by the pushing of the brush while the cleaning width in the peripheral area 14 on the front surface or in the peripheral area 112 on the back surface of the wafer W is obtained securely.

Furthermore, although the brush 16 is rotated while the brush 16 is in contact with the wafer W, the brush 16 may not be rotated but be kept stationary.

Moreover, a configuration in which the brush 16 and the peripheral portion of the wafer W are moved relatively to each other by the rotation of the wafer W is taken as an example. However, when a rectangular substrate is treated, it may be possible to use a configuration in which the substrate is kept stationary and the brush is moved along the peripheral portion of the substrate, for example. It may also be possible to relatively move the brush along the peripheral portion of the substrate while both the substrate and the brush are moved, as a matter of course.

It may also be possible that at least one of a front surface cleaning brush for cleaning the central area on the front surface (upper surface) of the wafer W held by the spin chuck 3, an ultrasonic cleaning nozzle for supplying to the wafer W a treatment liquid to which an ultrasonic wave is added and a two-fluid nozzle for supplying liquid droplets generated by mixing a gas and a liquid to the wafer W is disposed additionally.

Figure 13:
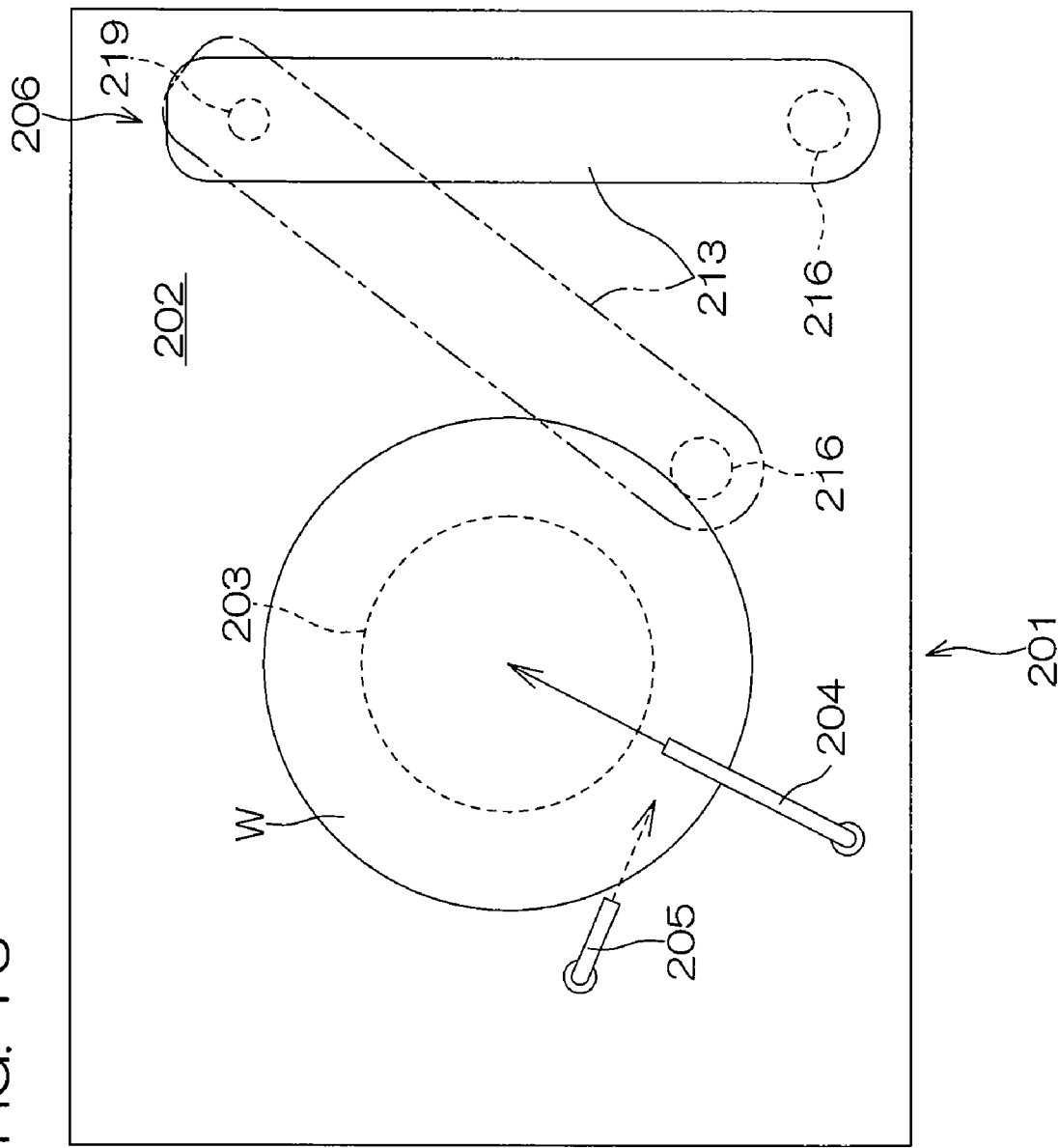
FIG. 13 is a plan view showing the schematic configuration of a substrate treatment apparatus according to a second embodiment of the present invention.
Figure 14:
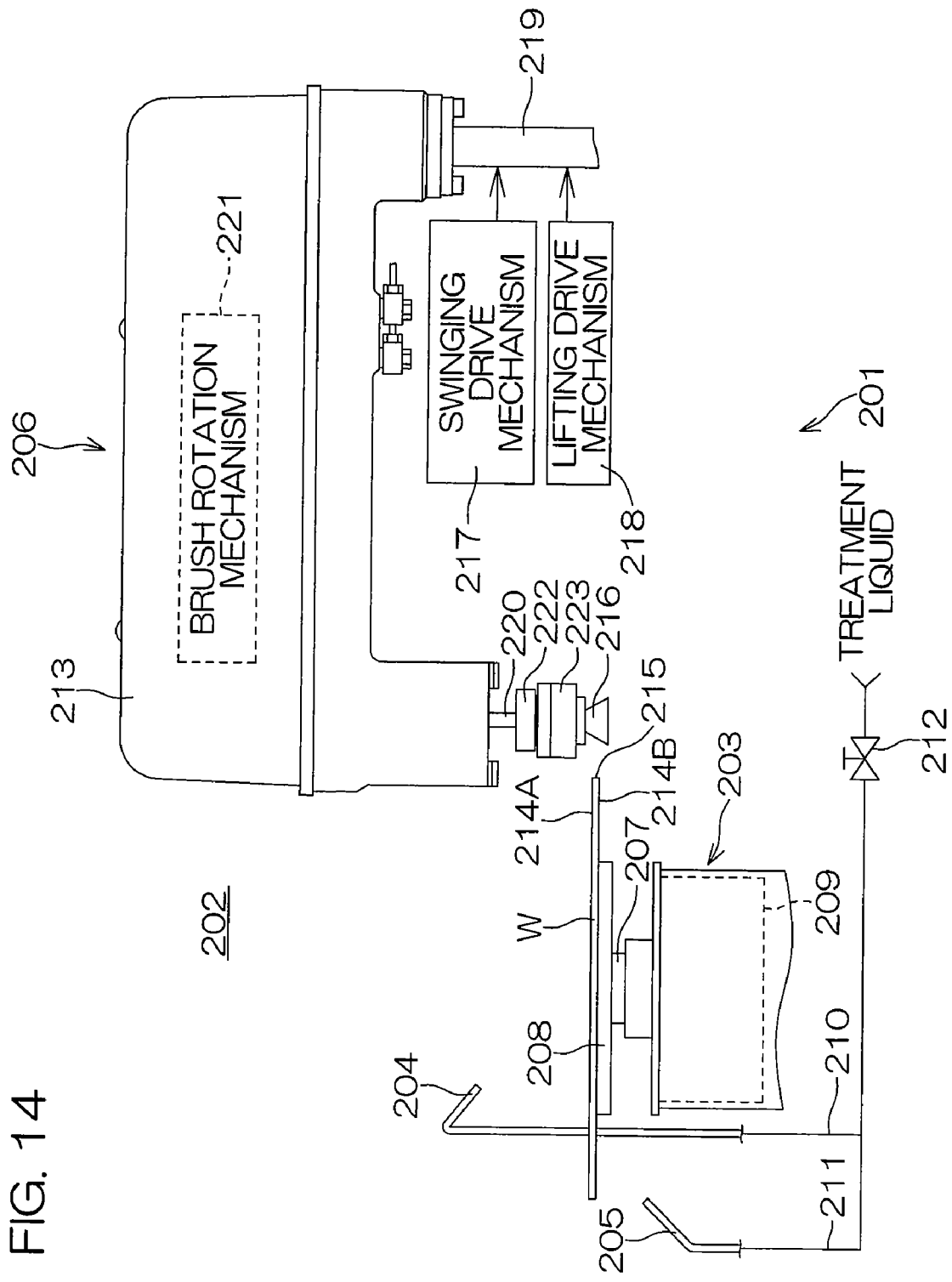
FIG. 14 is an illustrative side view showing the interior of the substrate treatment apparatus shown in FIG. 13.

FIG. 13 is a plan view showing the schematic configuration of a substrate treatment apparatus according to the second embodiment of the present invention. FIG. 14 is an illustrative side view showing the interior of the substrate treatment apparatus shown in FIG. 13.

This substrate treatment apparatus 202 is of a single wafer processing type for processing semiconductor wafers W (hereinafter referred to simply as "wafer W") as an example of a substrate one by one. The substrate treatment apparatus 202 includes a spin chuck 203 for holding a wafer W generally horizontally and rotating it, a front surface nozzle 204 for supplying a treatment liquid to the front surface (the surface on which devices are formed: upper surface in the present embodiments) of the wafer W, a back surface nozzle 205 for supplying a treatment liquid to the back surface of the wafer W: lower surface in the present embodiments), and a brushing mechanism 206 for cleaning the peripheral portion of the wafer W, inside a treatment chamber 202 divided by a partition wall.

The spin chuck 203 is a vacuum suction chuck. The spin chuck 203 includes a spin shaft 207 extending in a generally vertical direction, a suction base 208 mounted to the upper end of the spin shaft 207 for sucking and holding the back surface (lower surface) of the wafer W in a generally horizontal posture, and a spin motor 209 having a rotation shaft coaxially connected to the spin shaft 207. With this configuration, when the spin motor 209 is driven while the back surface of the wafer W is sucked and held by the suction base 208, the wafer W is rotated around the central axis of the spin shaft 207.

Treatment liquid supply pipes 210 and 211 are connected to the front surface nozzle 204 and the back surface nozzle 205, respectively. To these treatment liquid supply pipes 210 and 211, a treatment liquid is supplied from a treatment liquid supply source not shown via a treatment liquid valve 212. The front surface nozzle 204 discharges the treatment liquid supplied through the treatment liquid supply pipe 210 toward the center of the front surface of the wafer W held by the spin chuck 203. In addition, the back surface nozzle 205 discharges the treatment liquid supplied through the treatment liquid supply pipe 211 toward the area between the peripheral end edge of the back surface of the wafer W held by the spin chuck 203 and the suction base 208.

Pure water is used as the treatment liquid. Instead of pure water, it may be possible to use functional water such as carbonated water, ionized water, ozone water, regenerated water (hydrogen water) or magnetic water, as the treatment liquid. Furthermore, it is also possible to use a chemical liquid, such as ammonia water, or a mixture of ammonia water and a hydrogen peroxide solution, as the treatment liquid.

The brushing mechanism 206 includes a swinging arm 213 disposed above the position of the wafer W held by the spin chuck 203 and extending generally horizontally a brush 216, held at the tip end of this swinging arm 213, for cleaning a peripheral area 214A on the front surface (for example, a ring-shaped area with a width of 1 to 4 mm from the peripheral end edge of the wafer W), a peripheral area 214B on the back surface (for example, a ring-shaped area with a width of 1 to 2 mm from the peripheral end edge of the wafer W), and the peripheral end face 215 of the wafer W; a swinging drive mechanism 217 for swinging the swinging arm 213 in the horizontal direction around the vertical axis set outside the rotation range of the wafer W; and a lifting drive mechanism 218 for raising and lowering the swinging arm 213.

The peripheral portion of the wafer W is a portion including at least the peripheral area 214A on the front surface, the peripheral area 214B on the back surface and the peripheral end face 215 of the wafer W.

To the base end portion of the swinging arm 213, the upper end portion of an arm supporting shaft 219 extending in the vertical direction is connected. To this arm supporting shaft 219, the drive force of the swinging drive mechanism 217 is input. The swinging arm 213 can be swung around the arm supporting shaft 219 by inputting the drive force of the swinging drive mechanism 217 to the arm supporting shaft 219 and reciprocally rotating the arm supporting shaft 219. Furthermore, to the arm supporting shaft 219, the lifting drive mechanism 218 is connected. The swinging arm 213 can be raised and lowered together with the arm supporting shaft 219 by raising and lowering the arm supporting shaft 219 using the lifting drive mechanism 218.

By the tip end portion (distal end portion) of the swinging arm 213, a brush rotation shaft 220 is held rotatably. This brush rotation shaft 220 extends in the vertical direction and passes through the lower surface of the tip end portion of the swinging arm 213. Inside the swinging arm 213, a brush rotation mechanism 221 for rotating the brush rotation shaft 220 is connected to the brush rotation shaft 220. On the other hand, to the lower end portion of the brush rotation shaft 220, a holder mounting portion 222 is fixed. To this holder mounting portion 222, the brush 216 is mounted via a brush holder 223.

Figure 15:
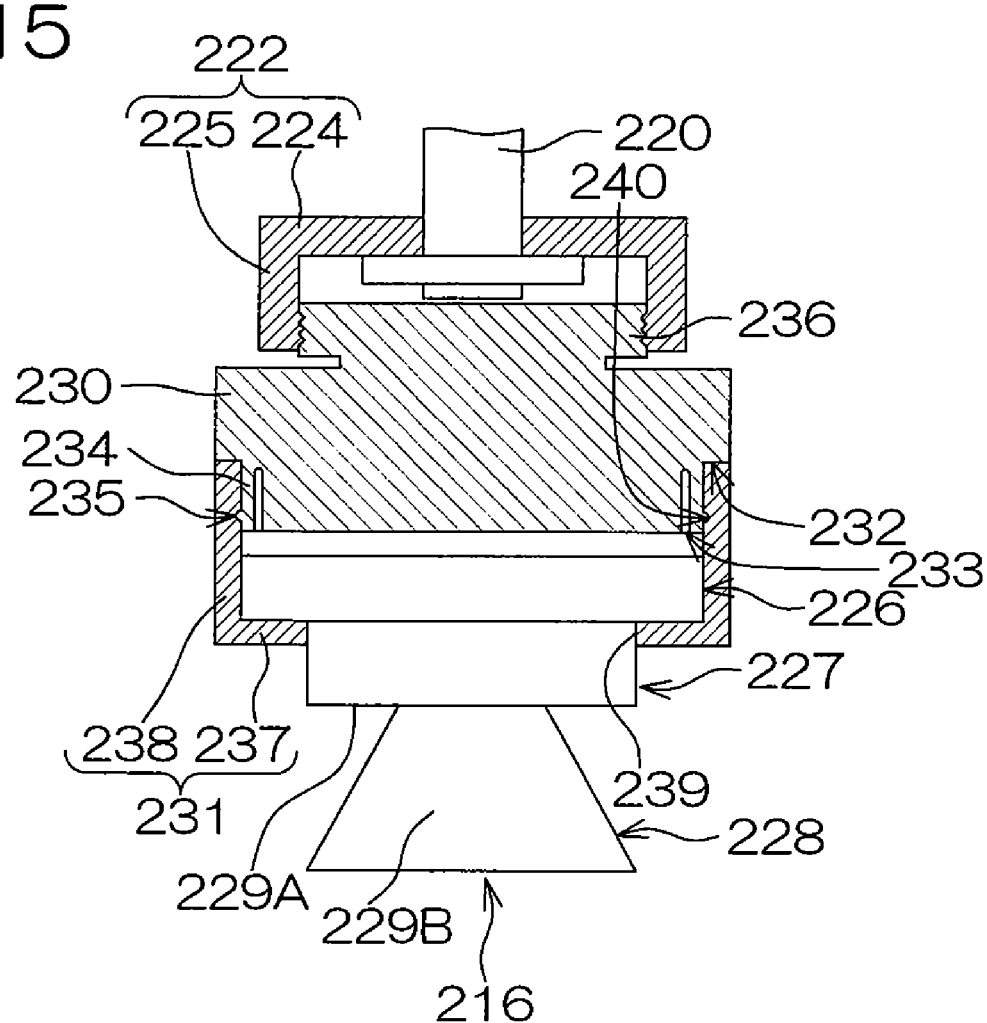
FIG. 15 is a sectional view showing the holder mounting portion, the brush and the brush holder shown in FIG. 14.

FIG. 15 is a sectional view showing the configurations of the brush 216 and the brush holder 223.

The holder mounting portion 222 integrally includes a disc-like upper surface portion 224, through the center of which the brush rotation shaft 220 is inserted and which is fixed to the brush rotation shaft 220, and a cylindrical side surface portion 225 extending downward from the peripheral edge of this upper surface portion 224. On the inner circumferential surface of the side surface portion 225, a screw thread is formed which can be screw-engaged with the screw thread formed in the screw portion 236 of the brush holder 223, the screw portion 236 being described later.

The brush 216 is made of a sponge material (porous material) formed of an elastically deformable material, such as PVA (polyvinyl alcohol) and urethane. The brush 216 integrally includes a base portion 226 having a generally disc-like shape; a body portion 227 disposed on the end face on the tip end side of this base portion 226 and having a generally disc-like shape (flat columnar shape) the diameter of which is smaller than that of the base portion 226; and a first peripheral end face contact portion 228 connected to the end face on the tip end side of the body portion 227 and having a generally truncated conical shape expanding toward the tip end thereof (the diameter of which is larger as it approaches the lower portion of itself). The base portion 226, the body portion 227 and the first peripheral end face contact portion 228 have the same central axis. The brush 216 has a shape being rotationally symmetrical around the central axis thereof.

In the brush 216, the ring band-shaped portion around the first peripheral end face contact portion 228 on the end face on the tip end side of the body portion 227 serves as a first cleaning surface 229A that makes contact with the peripheral area 214A on the front surface of the wafer W. Furthermore, the upper end edge of the side surface is continuous with the first cleaning surface 229A, and the side surface of the first peripheral end face contact portion 228 is inclined at an inclination angle of 45 degrees with respect to the vertical direction so as to be spaced away from the central axis of the brush 216 as it approaches the lower portion of itself, and serves as a second cleaning surface 229B that makes contact with the peripheral end face 215 of the wafer W.

The brush holder 223 includes a resin block 230 having a generally columnar shape; and a fixing member 231 for fixing the brush 216 to this resin block 230.

A fitting groove 232 having a generally rectangular shape in section is formed around the entire circumference of the circumferential surface of one end portion of the resin block 230. In addition, on the one end portion of the resin block 230, a slit groove 233 having a generally U shape in section is formed in the circumferential direction at a position spaced away from the fitting groove 232 with a very small distance inward in the radial direction. With this configuration, the portion between the fitting groove 232 and the slit groove 233 serves as an elastic piece 234 to which the elasticity due to the flexibility of the resin is given. On the outer circumferential surface of this elastic piece 234, a plurality of hemispherical engaging protrusions 235 are formed. On the other hand, on the end surface on the other side of the resin block 230, a flat columnar screw portion 236 is formed integrally. On the circumferential surface of this screw portion 236, a screw is formed which can be screw-engaged with the screw thread formed in the holder mounting portion 222 described later.

The fixing member 231 integrally includes a disc portion 237 having a generally circular outer shape and a cylindrical portion 238 having a generally cylindrical shape and extending from the peripheral edge of this disc portion 237 to one side thereof. At the central portion of the disc portion 237, an insertion hole 239 for allowing the body portion 227 of the brush 216 to insert therethrough is formed. The inner diameter of the cylindrical portion 238 is generally equal to the outer diameter of the base portion 226 of the brush 216. In addition, the inner diameter of the cylindrical portion 238 is made slightly smaller than the outer diameter of the elastic piece 234 when no external force is applied to the elastic piece 234. Further, on the inner circumferential surface of the cylindrical portion 238, a plurality of engaging concave portions 240 that can be engaged with the respective engaging protrusions 235 are formed.

The body portion 227 of the brush 216 is inserted through the insertion hole 239 of the fixing member 231, the base portion 226 is accommodated inside the cylindrical portion 238, the cylindrical portion 238 is fitted in the fitting groove 232 of the resin block 230, and the engaging protrusions 235 are engaged with the respective engaging concave portions 240, whereby the brush 216 is held by the brush holder 223. Then, the screw portion 236 of the brush holder 223 is screw-engaged with the holder mounting portion 222, whereby the brush 216 is mounted to the holder mounting portion 222.

Figure 16:
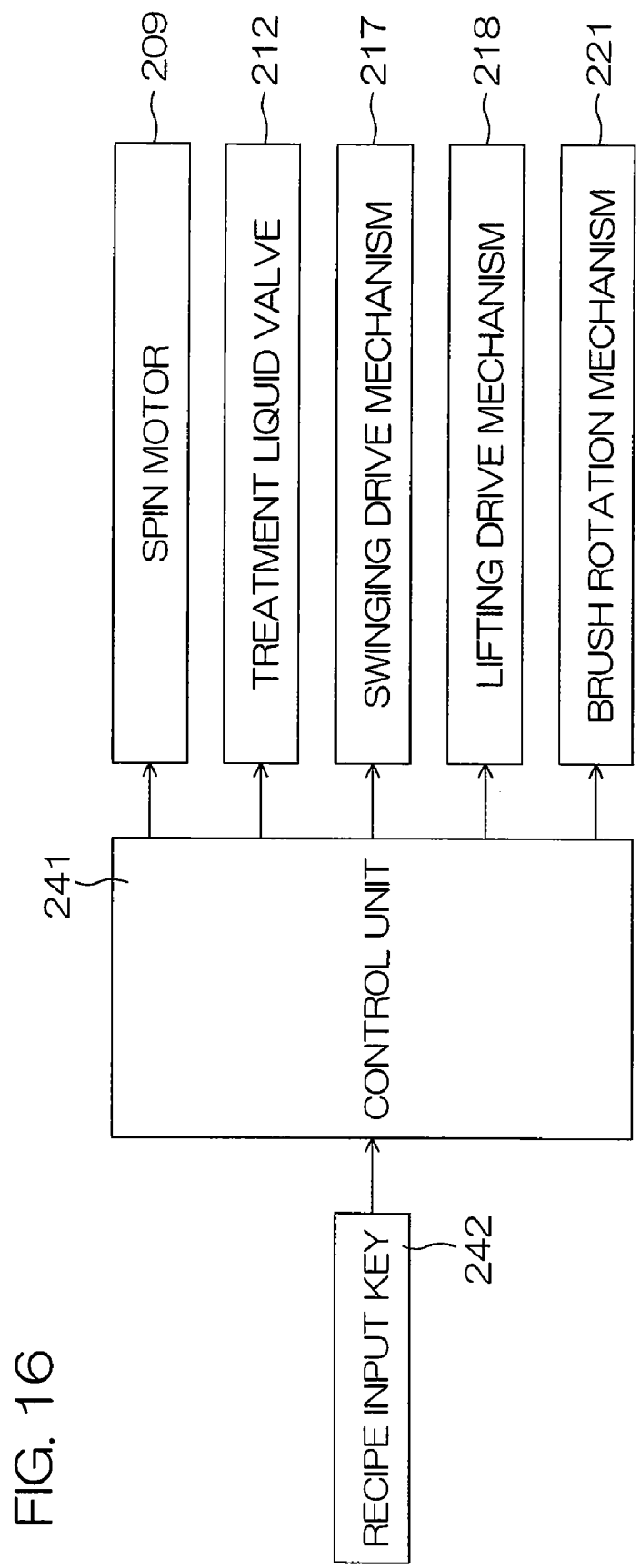
FIG. 16 is a block diagram illustrating the electrical configuration of the substrate treatment apparatus shown in FIG. 13.

FIG. 16 is a block diagram illustrating the electrical configuration of the substrate treatment apparatus 1.

The substrate treatment apparatus 201 includes a control unit 241 including a microcomputer. To this control unit 241, a recipe input key 242 for allowing the user to input a treatment recipe (various conditions for treating the wafer W) is connected. Furthermore, to the control unit 241, the spin motor 209, the treatment liquid valve 212, the swinging drive mechanism 217, the lifting drive mechanism 218, the brush rotation mechanism 221, etc., are connected as objects to be controlled.

Figure 17:
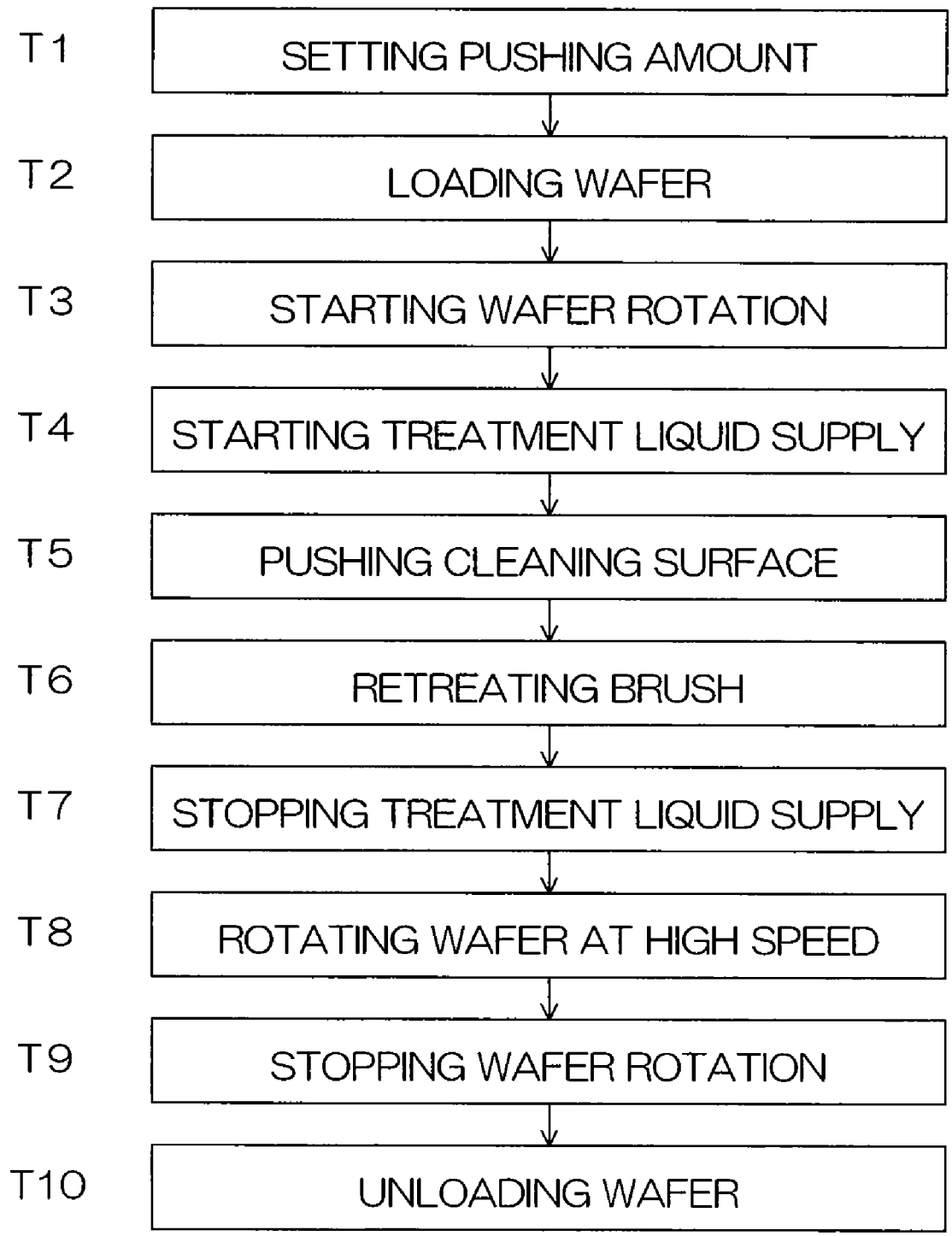
FIG. 17 is a process chart for explaining the wafer treatment in the substrate treatment apparatus shown in FIG. 13.
Figure 18:
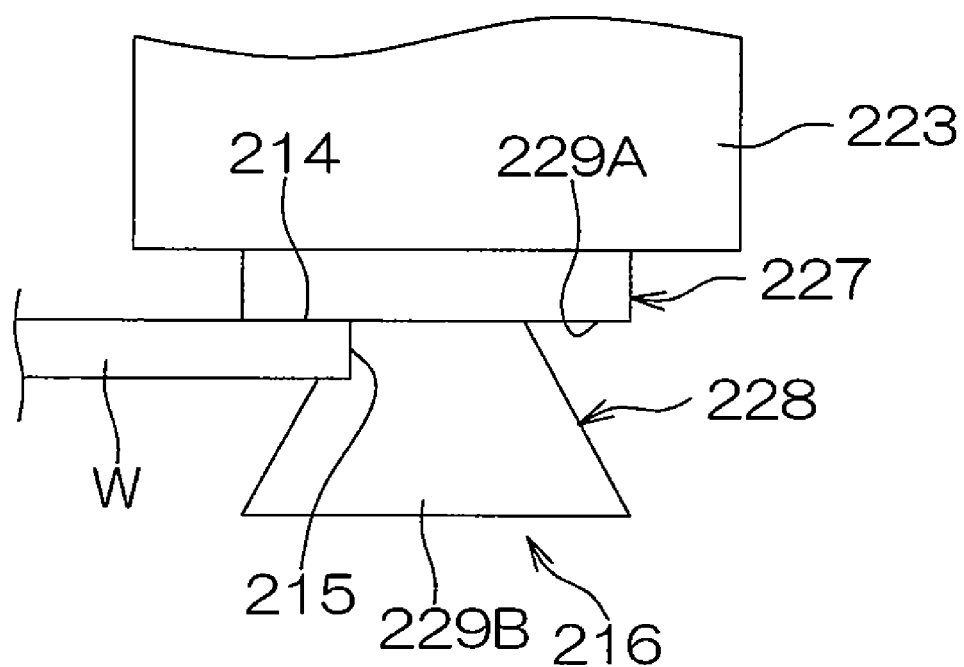
FIG. 18 is a side view showing a state of the brush during the wafer treatment in the substrate treatment apparatus shown in FIG. 13.

FIG. 17 is a process chart for explaining the treatment of the wafer W in the substrate treatment apparatus 201. FIG. 18 is a side view showing the state of the brush 216 during the treatment of the wafer W.

Before the wafer W is treated, the recipe input key 242 is operated by the user, and the pushing amount of the brush 216 to the wafer W in the vertical direction (in a perpendicular direction to the front surface of the wafer W) and the pushing amount of the brush 216 to the wafer W in the horizontal direction (in a direction parallel to the front surface of the wafer W) are set (step T1). The pushing amounts in the vertical direction and the horizontal direction are the elastic deformation amounts of the brush 216 in the vertical direction and the horizontal direction when the brush 216 is pushed to the peripheral portion of the wafer W. More specifically, the pushing amount in the vertical direction is a displacement amount from the state in which the first cleaning surface 229A of the brush 216 is in contact with the peripheral area 214A on the front surface of the wafer W to the state in which the first cleaning surface 229A is pushed to the peripheral area 214A by displacing the brush 216 in the vertical direction while deforming it elastically. Furthermore, the pushing amount in the horizontal direction is a displacement amount from the state in which the second cleaning surface 229B of the brush 216 is in contact with the peripheral end face 215 of the wafer W to the state in which the second cleaning surface 229B is pushed to the peripheral end face 215 by displacing the brush 216 in the horizontal direction while deforming it elastically.

The wafer W loaded into the treatment chamber 202 is held by the spin chuck 203 (step T2). Then, the spin motor 209 is controlled by the control unit 241, and the rotation of the wafer W by the spin chuck 203 is started (step T3). The wafer W is rotated at a rotation speed of 100 rpm, for example. Next, the treatment liquid valve 212 is opened by the control unit 241, and the supply of the treatment liquid from the front surface nozzle 204 and the back surface nozzle 205 to the front surface and the back surface of the wafer W, respectively, is started (step T4).

In addition, the brush rotation mechanism 221 is controlled by the control unit 241, and the brush 216 is rotated in the same rotation direction as that of the wafer W at a rotation speed of 100 to 200 rpm. Then, the swinging drive mechanism 217 and the lifting drive mechanism 218 are controlled by the control unit 241, and the first cleaning surface 229A of the brush 216 is pushed to the peripheral area 214A on the front surface of the wafer W, while the second cleaning surface 229B is pushed to the peripheral end face 215 and the peripheral area 214B on the back surface of the wafer W (step T5). More specifically, the swinging drive mechanism 217 and the lifting drive mechanism 218 are controlled, and the brush 216 is moved to the position where the first cleaning surface 229A thereof makes contact with the peripheral area 214A on the front surface of the wafer W and the second cleaning surface 229B thereof makes contact with the peripheral end face 215 of the wafer W. Then, the lifting drive mechanism 218 is controlled, so that the brush 216 is lowered by the pushing amount in the vertical direction set using the recipe input key 242, and the first cleaning surface 229A of the brush 216 is pushed to the peripheral area 214A on the front surface of the wafer W. Furthermore, around this time, the swinging drive mechanism 217 is controlled, so that the brush 216 is moved toward the wafer W by the pushing amount in the horizontal direction set using the recipe input key 242, and the second cleaning surface 229B of the brush 216 is pushed to the peripheral end face 215 of the wafer W. Since the second cleaning surface 229B is inclined so as to be spaced away from the central axis of the brush 216 as it approaches the lower portion of itself, when the second cleaning surface 229B is pushed to the peripheral end face 215 of the wafer W, the second cleaning surface 229B is deformed elastically, is bent around the peripheral area 214B on the back surface of the wafer W and makes contact therewith. Therefore, the peripheral area 214A on the front surface and the peripheral end face 215 of the wafer W can be cleaned, and at the same time, the peripheral area 214B on the back surface of the wafer W can also be cleaned.

Furthermore, while the peripheral area 214A on the front surface, the peripheral end face 215 and the peripheral area 214B on the back surface of the wafer W are cleaned, contaminants attached to the central area (device forming area) located inward of the peripheral area 214A on the front surface of the wafer W can be cleaned away by the treatment liquid supplied to the front surface of the wafer W. In addition, pure water serving as the treatment liquid also serves as a protective liquid for preventing the contaminants removed from the peripheral area 214A and the peripheral end face 215 by the brush 216 from entering the central area (device forming area) on the front surface of the wafer W. When the treatment liquid is used as a protective liquid, it is preferable to select a treatment liquid that does not adversely affect the device forming area on the front surface of the wafer W, for example, carbonated water, ionized water, regenerated water (hydrogen water), or functional water such as magnetic water, in addition to pure water.

When a predetermined time has passed after the start of the cleaning by the brush 216, the swinging drive mechanism 217 and the lifting drive mechanism 218 are controlled by the control unit 241, and the brush 216 is retreated to its home position at which the brush 216 is located before the start of the treatment (step T6). In addition, while the brush 216 is returned to its home position, the drive of the brush rotation mechanism 221 is stopped, and the rotation of the brush 216 is stopped. Furthermore, the treatment liquid valve 212 is closed by the control unit 241, and the supply of the treatment liquid from the front surface nozzle 204 and the back surface nozzle 205 is stopped (step T7).

Then, the spin motor 209 is controlled by the control unit 241, and the wafer W is rotated at a high speed (for example, 3000 rpm) (step T8). Therefore, the treatment liquid attached to the wafer W is spun off, and the wafer W can be dried.

After the high-speed rotation of the wafer W is continued for a predetermined time, the spin motor 209 is stopped, and the rotation of the wafer W by the spin chuck 203 is stopped (step T9). Then, after the wafer W becomes stationary, the wafer W having been treated is unloaded from the treatment chamber 202 (step T10).

After the treatment in the substrate treatment apparatus 201, the back surface of the wafer W is cleaned in another substrate treatment apparatus (treatment chamber) to remove contaminants (suction traces) attached to the contact portion between the back surface of the wafer W and the suction base 208 of the spin chuck 203.

As described above, the peripheral area 214A on the front surface and the peripheral end face 215 of the wafer W can be cleaned simultaneously by pushing the first cleaning surface 229A of the brush 216 to the peripheral area 214A and the second cleaning surface 229B of the brush 216 to the peripheral end face 215.

Moreover, since the brush 216 is pushed to the peripheral area 214A on the front surface of the wafer W by the pushing amount set using the recipe input key 242, the pushing force of the brush 216 to the peripheral area 214A on the front surface of the wafer W can be obtained securely regardless of the thickness of the wafer W, whereby the peripheral area 214A on the front surface of the wafer W can be cleaned satisfactorily.

Furthermore, since the first cleaning surface 229A is a flat face, the pushing force of the brush 216 to the peripheral area 214A on the front surface of the wafer W can be made identical in the entire contact portion between the first cleaning surface 229A and the peripheral area 214A on the front surface of the wafer W. Therefore, the peripheral area 214A on the front surface of the wafer W can be cleaned uniformly.

Furthermore, since the first cleaning surface 229A does not make contact with the area (central area) located inward of the peripheral area 214A on the front surface of the wafer W, the treatment can be carried out while the peripheral area 214A that should be cleaned by the brush 216 is clearly distinguished from the central area that is not required to be cleaned by the brush 216. Therefore, the accuracy of the cleaning width in the peripheral area 214A on the front surface of the wafer W can be improved, and devices are prevented from being damaged by the brush 216 while the cleaning width is obtained securely to the maximum extent.

Moreover, since the second cleaning surface 229B is inclined so as to be spaced away from the central axis of the brush 216 as it approaches the lower portion of itself, when the second cleaning surface 229B is pushed to the peripheral end face 215 of the wafer W, the second cleaning surface 229B is deformed elastically, is bent around the peripheral area 214B on the back surface of the wafer W and makes contact therewith. Therefore, the peripheral area 214A on the front surface and the peripheral end face 215 of the wafer W can be cleaned, and at the same time, the peripheral area 214B on the back surface of the wafer W can also be cleaned. In other words, the peripheral portion of the wafer W (the peripheral area 214A on the front surface and the peripheral area 214B on the back surface and the peripheral end face 215) can all be cleaned simultaneously, and the cleaning treatment for the peripheral portion of the wafer W can be carried out efficiently.

Devices are formed in the central area on the front surface of the wafer W, but no device is formed on the back surface of the wafer W. For this reason, the cleaning width in the peripheral area 214A on the front surface of the wafer W is required to have high accuracy, but the cleaning width in the peripheral area 214B on the back surface of the wafer W is not required to have such high accuracy as that on the front surface of the wafer W. Therefore, in this case, accurate cleaning of the peripheral area 214A on the front surface of the wafer W by the first cleaning surface 229A and cleaning of the peripheral area 214B on the back surface of the wafer W by the second cleaning surface 229B are particularly effective as in the case of this embodiment.

In addition, while the brush 216 is pushed to the wafer W, the wafer W is rotated by the spin chuck 203, and the brush 216 and the peripheral portion of the wafer W are moved relatively, whereby the peripheral portion of the wafer W can be cleaned efficiently.

Furthermore, while the brush 216 is pushed to the wafer W, the brush 216 is rotated in the same direction as that of the wafer W. Therefore, the peripheral portion of the wafer W can be scrubbed, and the peripheral portion of the wafer W can be cleaned more satisfactorily. The rotation direction of the brush 216 may be opposite to the rotation direction of the wafer W. However, when the rotation direction is the same as that of the wafer W, the wafer W and the brush 216 can be rubbed with each other. Accordingly, cleaning with a higher quality can be attained.

Figure 19:
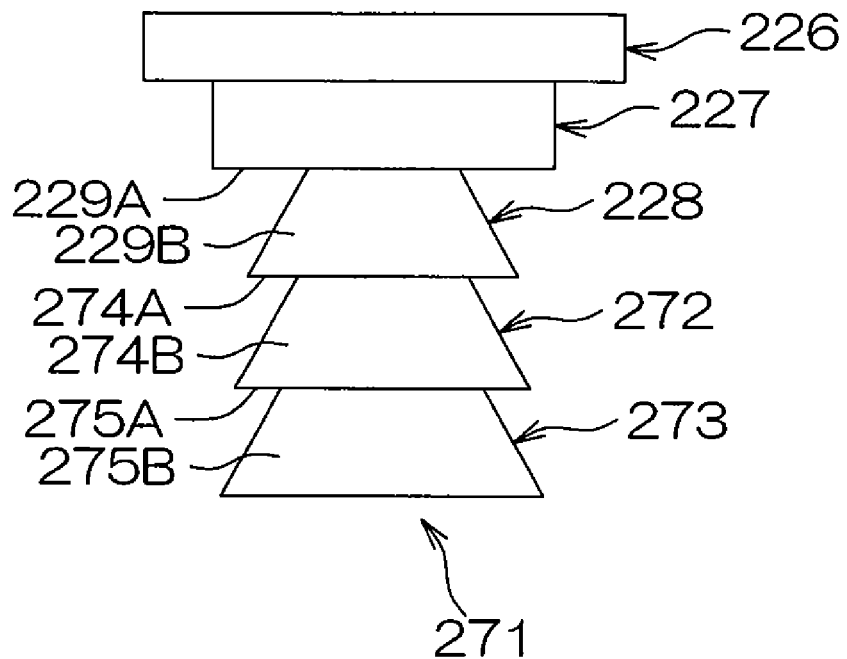
FIG. 19 is a side view showing another configuration of the brush (further including a second peripheral end face contact portion and a third peripheral end face contact portion) for use in the substrate treatment apparatus shown in FIG. 13.

FIG. 19 is a side view showing another configuration of the brush for use in the substrate treatment apparatus 201. In FIG. 19, components corresponding to the components shown in FIG. 15 are designated using the same reference numerals as those of the components shown in FIG. 15. Furthermore, detailed descriptions of the components designated using the same reference numerals are omitted below.

A brush 271 shown in FIG. 19 integrally includes a second peripheral end face contact portion 272 and a third peripheral end face contact portion 273, each formed in a generally truncated conical shape, on the tip end side of a first peripheral end face contact portion 228 having a generally truncated conical shape. The central axis of the second peripheral end face contact portion 272 is aligned with the central axis of the first peripheral end face contact portion 228, and the end face on the small diameter side thereof is connected to the central portion of the end face (the end face on the large diameter side) of the first peripheral end face contact portion 228 on the tip end side. Furthermore, the central axis of the third peripheral end face contact portion 273 is aligned with the central axis of the second peripheral end face contact portion 272, and the end face there of on the small diameter side is connected to the central portion of the end face (the end face on the large diameter side) of the second peripheral end face contact portion 272 on the tip end side.

In the brush 271, the ring band-shaped portion around the second peripheral end face contact portion 272 on the end face of the first peripheral end face contact portion 228 on the tip end side serves as a third cleaning surface 274A that makes contact with the peripheral area 214A on the front surface of the wafer W. The distance from the inside diameter of this third cleaning surface 274A to the outside diameter thereof (hereinafter, simply referred to as the width of the cleaning surface) is smaller than the width of the first cleaning surface 229A. Furthermore, the upper end edge of the side surface of the second peripheral end face contact portion 272 is continuous with the third cleaning surface 274A, and the side surface is inclined at an inclination angle of 45 degrees with respect to the vertical direction so as to be spaced away from the central axis as it approaches the lower portion of itself, and serves as a fourth cleaning surface 274B that makes contact with the peripheral end face 215 of the wafer W.

Additionally, the ring band-shaped portion around the third peripheral end face contact portion 273 on the end face on the tip end side of the second peripheral end face contact portion 272 serves as a fifth cleaning surface 275A that makes contact with the peripheral area 214A on the front surface of the wafer W. The width of the fifth cleaning surface 275A is made smaller than the width of the third cleaning surface 274A. Furthermore, the upper end edge of the side surface of the third peripheral end face contact portion 273 is continuous with the fifth cleaning surface 275A, and the side surface of the third peripheral end face contact portion 273 is inclined at an inclination angle of 45 degrees with respect to the vertical direction so as to be spaced away from the central axis as it approaches the lower portion of itself, and serves as a sixth cleaning surface 275B that makes contact with the peripheral end face 215 of the wafer W. For example, the width of the first cleaning surface 229A is 4 mm, the width of the third cleaning surface 274A is 3 mm, and the width of the fifth cleaning surface 275A is 2 mm.

When the brush 271 is used, the cleaning width in the peripheral area 214A on the front surface of the wafer W is set using the recipe input key 242 by the user before the treatment of the wafer W. When the wafer W is treated, the first cleaning surface 229A, the third cleaning surface 274A or the fifth cleaning surface 275A is selected by the control unit 241 (see FIG. 16) depending on the cleaning width set using the recipe input key 242. The first cleaning surface 229A, the third cleaning surface 274A or the fifth cleaning surface 275A selected as described above is pushed to the peripheral area 214A on the front surface of the wafer W. Since the first cleaning surface 229A, the third cleaning surface 274A and the fifth cleaning surface 275A have widths different from one another as described above, the cleaning width in the peripheral area 214A on the front surface of the wafer W can be changed easily by selectively using the first cleaning surface 229A, the third cleaning surface 274A and the fifth cleaning surface 275A.

The first cleaning surface 229A, the third cleaning surface 274A and the fifth cleaning surface 275A may have the same width. In this case, when the first cleaning surface 229A and the second cleaning surface 229B are worn out by the cleaning of the wafer W or when contaminants are accumulated excessively in partial areas of the first cleaning surface 229A and the second cleaning surface 229B to the extent that the cleaning of the wafer W is hindered, the third cleaning surface 274A and the fourth cleaning surface 274B or the fifth cleaning surface 275A and the sixth cleaning surface 275B can be used, that is, the cleaning surfaces used for cleaning the wafer W can be changed with other cleaning surfaces. Accordingly, the peripheral portion of the wafer W can be cleaned satisfactorily without interruption.

Figure 20:
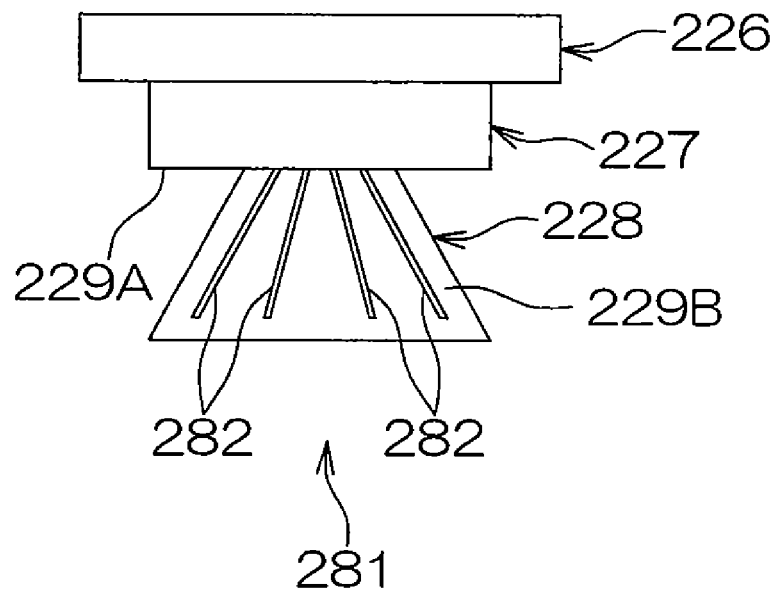
FIG. 20 is a side view showing still another configuration of the brush (where grooves are formed in the cleaning surface) for use in the substrate treatment apparatus shown in FIG. 13.

FIG. 20 is a side view showing still another configuration of the brush for use in a substrate treatment apparatus 201. In FIG. 20, components corresponding to the components shown in FIG. 15 are designated using the same reference numerals as those of the components shown in FIG. 15. Furthermore, detailed descriptions of the components designated using the same reference numerals are omitted below.

A plurality of grooves 282 are formed in the second cleaning surface 229B of a brush 281 shown in FIG. 20. Each of the grooves 282 extends linearly along the generating line of the cleaning surface 229B so that at least one end (upper end) thereof reaches the second cleaning surface 229B.

Since the grooves 282 are formed in the second cleaning surface 229B of the brush 281 as described above, contaminants relatively firmly attached to the peripheral area 214B on the back surface and the peripheral end face 215 of the wafer W can be scraped off by the brush 281. Furthermore, the contaminants scraped off from the wafer W by the brush 281 can be removed through the grooves 282 from the space between the second cleaning surface 229B and the wafer W. Therefore, the wafer W can be cleaned more satisfactorily using the brush 281.

The grooves 282 are not limited to ones having the linear shape formed along the generating line of the second cleaning surface 229B. The grooves 282 may have a ring shape formed along the circumference of the second cleaning surface 229B. In addition, only one groove 282 may also be formed. When only one groove 282 is formed, the groove 282 may be formed in a spiral shape.

<Cleaning Effect Checking Test>

Figure 21:
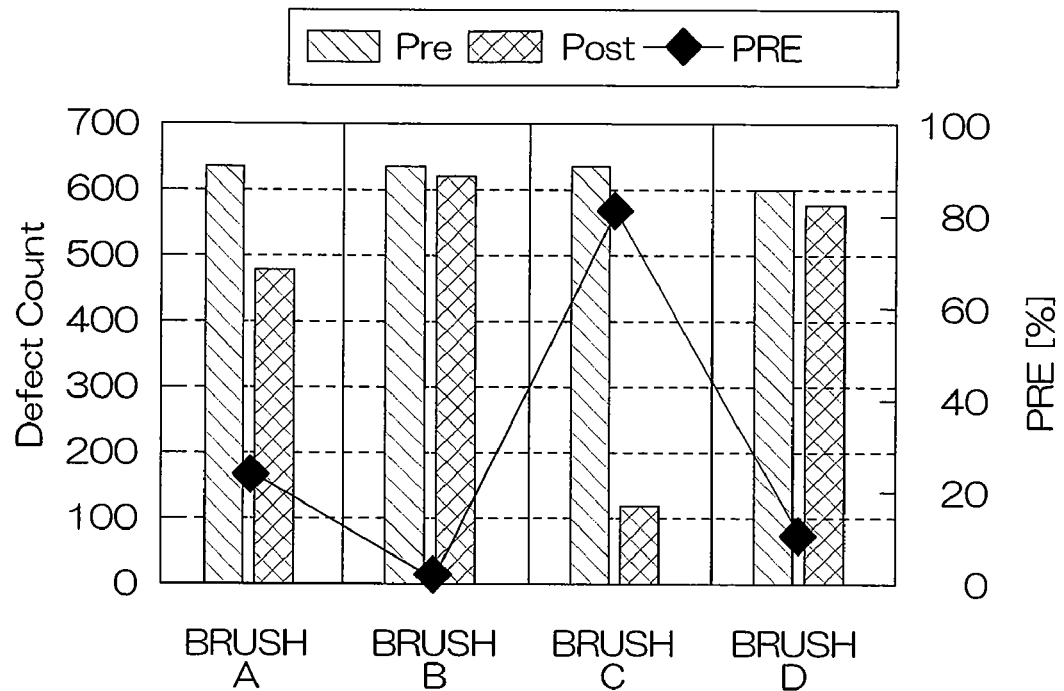
FIG. 21 is a graph showing the results of a test for checking the cleaning effects of brushes of various shapes.

FIG. 21 is a graph showing the results of a test for checking the cleaning effects of brushes of various shapes.

The inventors of the present application made brushes formed of PVA and having four kinds of shapes, that is, brushes A, B, C and D, selectively mounted these brushes A to D on the brush scrubber (trade name: SS-3000) manufactured by Dainippon Screen Mfg. Co., Ltd., and cleaned the peripheral portion of the wafer W by the brushes A to D mounted on the brush scrubber. The number of particles attached to the peripheral area 214A on the front surface, the peripheral area 214B on the back surface and the peripheral end face 215 of the wafer W was counted using the edge tester (trade name: RXW-800) manufactured by Raytex Corporation before and after the cleaning. The results (Pre) of the counting before the cleaning are indicated by hatched bars in the bar graph shown in FIG. 21. The results (Post) of the counting after the cleaning are indicated by brick-patterned bars in the bar graph shown in FIG. 21. Furthermore, the particle removal efficiency (PRE) calculated from the counting results before and after the cleaning is indicated by the line graph shown in FIG.

21. The particle removal efficiency (PRE) is derived from the following mathematical expression: (PRE)=(Pre−Post)/Pre× 100 (%).

The brush A is a columnar brush having a central axis being parallel with the axis orthogonal to the front surface of the wafer W and disposed on the side of the wafer W. When the brush A was used for cleaning, the side surface of the brush A was pushed to the peripheral end face 215 of the wafer W. The particle removal efficiency in this cleaning was approximately 20%.

The brush B is a disc-like brush disposed generally parallel with the front surface of the wafer W such that the lower surface is opposed to the peripheral area 214A on the front surface of the wafer W. When the brush B was used for cleaning, the lower surface of the brush B was pushed from above to the peripheral area 214A on the front surface of the wafer W. However, the particles were hardly removed, and the particle removal efficiency in this cleaning was approximately 0%.

The brush C is a brush having the same shape as that of the brush 216 according to the second embodiment. When the brush C was used for cleaning, the peripheral area 214A on the front surface, the peripheral area 214B on the back surface and the peripheral end face 215 of the wafer W were cleaned as in the case of the second embodiment. The particle removal efficiency in this cleaning was approximately 80%.

The brush D is a cylindrical brush having a groove, into which the wafer W can be fitted, on the circumferential face thereof (refer to Document 3) and disposed on the side of the wafer W. When the brush D was used for cleaning, the peripheral portion of the wafer W was fitted into the groove of the brush D. The particle removal efficiency in this cleaning was approximately 10%.

According to the results, it is understood that the brush 216 according to the second embodiment is high in the performance of cleaning the peripheral area 214A on the front surface, the peripheral area 214B on the back surface and the peripheral end face 215 of the wafer W in comparison with the brushes A, B and D according to the conventional proposals.

Figure 22:
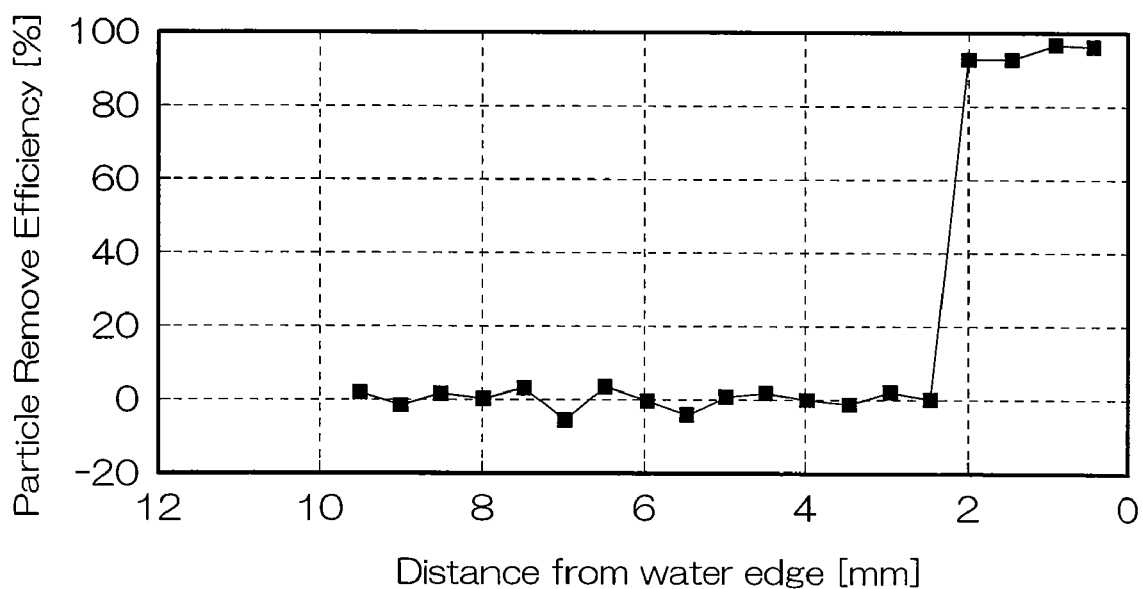
FIG. 22 is a graph showing the relationship between the distance from the peripheral edge on the front surface of a wafer and the particle removal efficiency.

FIG. 22 is a graph showing the relationship between the distance from the peripheral edge on the front surface of the wafer W and the particle removal efficiency.

In addition, the inventors of the present application prepared a wafer W to which Si (silicon) particles were attached. After the peripheral portion of this wafer W was cleaned by the brush 216, the number of particles attached to the peripheral area 214A on the front surface of the wafer W was counted using the defect/foreign matter inspection instrument (trade name: Surfscan SP1) manufactured by KLA-Tencor Corporation. Furthermore, the particle removal efficiency values at various positions on the peripheral area 214A on the front surface of the wafer W were obtained according to the results of the counting, and the relationship between the distance to each position from the peripheral edge of the wafer W and the particle removal efficiency was obtained. The results are shown in the line graph in FIG. 22. In this test, the cleaning width in the peripheral edge on the front surface of the wafer W was set at 2 mm.

As shown in FIG. 22, when the brush 216 is used for cleaning, the particle removal efficiency on the front surface of the wafer W abruptly changes from the position of 2 mm from the peripheral edge of the wafer W.

According to this result, when the brush 216 is used for cleaning, on the front surface of the wafer W, the area that is cleaned by the brush 216 can be clearly distinguished from the area that is not cleaned. It is thus understood that the accuracy of the cleaning width can be improved.

The configurations of the brushes 216, 271 and 281 according to the second embodiment may be combined appropriately. For example, grooves similar to the grooves 282 formed in the second cleaning surface 229B of the brush 281 may be formed in the second cleaning surface 229B, the fourth cleaning surface 274B and the sixth cleaning surface 275B of the brush 271.

In addition, linear grooves extending in the radial direction, ring-shaped grooves expanding in the circumferential direction, etc., may also be formed in the first cleaning surfaces 229A of the brushes 216 and 281, and the first cleaning surface 229A, the third cleaning surface 274A and the fifth cleaning surface 275A of the brush 271.

Furthermore, although the second cleaning surface 229B has an inclination angle of 45 degrees with respect to vertical direction, the inclination angle of the second cleaning surface 229B with respect to the vertical direction may be set in the range of 5 to 85 degrees. It is preferable that the inclination angle is set in the range of 30 to 60 degrees to prevent the wafer W from being deformed by the pushing of the brushes 216, 271 and 281 while the cleaning width in the peripheral area 214B on the back surface of the wafer W is obtained securely. The inclination angles of the fourth cleaning surface 274B and the sixth cleaning surface 275B of the brush 271 with respect to the vertical direction may also be set in the range of 5 to 85 degrees, as in the case of the second cleaning surface 229B, and it is preferable that the inclination angles are set in the range of 30 to 60 degrees.

Moreover, the second cleaning surface 229B, the fourth cleaning surface 274B and the sixth cleaning surface 275B may have a curved shape swelling outward in the direction of the rotation radius or a curved shape recessed inward in the direction of the rotation radius.

Furthermore, although the brush 216, 271, 281 are rotated while the brush 216, 271, 281 are in contact with the wafer W, the brush 16 may not be rotated but be kept stationary.

Moreover, a configuration in which the brush 216, 271, 281 and the peripheral portion of the wafer Ware moved relatively to each other by the rotation of the wafer W is taken as an example. However, when a rectangular substrate is treated, it may be possible to use a configuration in which the substrate is kept stationary and the brush is moved along the peripheral portion of the substrate, for example. It may also be possible to relatively move the brush along the peripheral portion of the substrate while both the substrate and the brush are moved, as a matter of course.

It may also be possible that at least one of a front surface cleaning brush for cleaning the central area on the front surface (upper surface) of the wafer W held by the spin chuck 203, an ultrasonic cleaning nozzle for supplying to the wafer W a treatment liquid to which an ultrasonic wave is added and a two-fluid nozzle for supplying liquid droplets generated by mixing a gas and a liquid to the wafer W is disposed additionally.

Furthermore, an apparatus for cleaning the peripheral portion of the wafer W using a treatment liquid, such as pure water, functional water or medical solution, is taken as an example. However, the substrate treatment apparatus may be an apparatus for etching the thin film of the peripheral portion of the wafer W. In this case, an etching solution including at least one of hydrofluoric acid, nitric acid, phosphoric acid, hydrochloric acid, oxalic acid and citric acid may be used as the treatment liquid. Alternatively, the substrate treatment apparatus may be an apparatus for removing reaction products, such as a polymer, from the peripheral portion of the wafer W. In this case, a polymer removal liquid, such as an organic amine removal liquid or an ammonium fluoride removal liquid, may be used as the treatment liquid. Moreover, the substrate treatment apparatus may also be an apparatus for removing the resist from the peripheral portion of the wafer W. In this case, a resist removal liquid including sulfuric acid/hydrogen peroxide mixture (SPM) or sulfuric acid ozone may also be used as the treatment liquid.

Furthermore, these embodiments are only specific examples for clarifying the technical concepts of the present invention, and the present invention should therefore not be construed as limited to only these specific examples. The spirit and scope of the present invention is limited only by the appended claims.

This application corresponds to Japanese Patent Application No. 2006-95549 and Japanese Patent Application No. 2006-95551, filed with the Japan Patent Office on Mar. 30, 2006. The entire disclosure of these applications shall be incorporated herein by reference.

What is claimed is:

1. A substrate treatment apparatus comprising:
  a substrate holding mechanism for holding a substrate;
  a brush made of an elastically deformable material and having a cleaning surface formed in a shape tapered toward one side in a perpendicular direction, perpendicular to one surface of the substrate held by the substrate holding mechanism, and inclined with respect to the perpendicular direction;
  a brush moving mechanism for moving the brush with respect to the substrate held by the substrate holding mechanism;
  a control unit for controlling the brush moving mechanism so that a peripheral portion of the substrate held by the substrate holding mechanism is pushed into the cleaning surface of the brush, and the cleaning surface is pushed to a peripheral area on the one surface and to a peripheral end face of the substrate held by the substrate holding mechanism; and
  a recipe input device linked with the control unit, for receiving a pushing amount of the brush to the peripheral end face of the substrate held by the substrate holding mechanism, input by a user, and providing said pushing amount to the control unit, the control unit arranged to control the brush moving mechanism on the basis of the pushing amount.

2. The substrate treatment apparatus according to claim 1, wherein
  the brush has a tip end portion formed in a generally conical shape being rotationally symmetrical around a central axis thereof extending in the perpendicular direction, and
  a side surface of the tip end portion is used as the cleaning surface.

3. The substrate treatment apparatus according to claim 2, wherein
  the cleaning surface has a curved shaped swelling outward in a direction of a rotation radius of the tip end portion.

4. The substrate treatment apparatus according to claim 2, wherein
  the cleaning surface has a curved shape recessed inward in the direction of the rotation radius of the tip end portion.

5. The substrate treatment apparatus according to claim 1, wherein
  the brush has a tip end portion formed in a generally truncated conical shape being rotationally symmetrical around the central axis thereof extending in the perpendicular direction, and
  a side surface of the tip end portion is used as the cleaning surface.

6. The substrate treatment apparatus according to claim 5, wherein
  the cleaning surface has a curved shape swelling outward in a direction of a rotation radius of the tip end portion.

7. The substrate treatment apparatus according to claim 5, wherein
  the cleaning surface has a curved shape recessed inward in a direction of a rotation radius of the tip end portion.

8. The substrate treatment apparatus according to claim 1, wherein
  a groove is formed in the cleaning surface.

9. The substrate treatment apparatus according to claim 1, comprising:
  a brush rotation mechanism for rotating the brush around the axis extending in the perpendicular direction.

10. The substrate treatment apparatus according to claim 1, comprising:
  a brush relative movement mechanism for relatively moving the substrate held by the substrate holding mechanism and the brush so that the brush is moved in a circumferential direction of the substrate.

11. The substrate treatment apparatus according to claim 1, comprising:
  a treatment liquid supply mechanism for supplying a treatment liquid to an area located more inward than the peripheral area on at least the one surface of the substrate held by the substrate holding mechanism.

12. The substrate treatment apparatus according to claim 1, wherein
  the substrate holding mechanism is arranged to hold the substrate generally horizontally, and
  the brush moving mechanism includes a swinging drive mechanism for swinging the brush in a horizontal direction around a vertical axis and a lifting drive mechanism for raising and lowering the brush.

13. The substrate treatment apparatus according to claim 1, wherein
  the cleaning surface is inclined at a constant angle with respect to the perpendicular direction.

14. The substrate treatment apparatus according to claim 13, wherein
  the brush has a tip end portion formed in a generally conical shape being rotationally symmetrical around a central axis thereof extending in the perpendicular direction, and
  a side surface of the tip end portion is used as the cleaning surface, and
  the cleaning surface is a conical surface.

15. The substrate treatment apparatus according to claim 13 wherein the constant angle is 45 degrees.

* * * * *